United States Patent
Hagedoorn

(10) Patent No.: US 10,198,847 B2
(45) Date of Patent: Feb. 5, 2019

(54) PHYSICALLY BASED SIMULATION METHODS FOR MODELING AND ANIMATING TWO-AND THREE-DIMENSIONAL DEFORMABLE OBJECTS

(71) Applicant: SIDE EFFECTS SOFTWARE INC., Toronto (CA)

(72) Inventor: Michiel Hagedoorn, Toronto (CA)

(73) Assignee: Side Effects Software Inc., Toronto (CA)

( * ) Notice: Subject to any disclaimer, the term of this patent is extended or adjusted under 35 U.S.C. 154(b) by 0 days.

(21) Appl. No.: 15/753,224

(22) PCT Filed: Aug. 17, 2016

(86) PCT No.: PCT/CA2016/000210
§ 371 (c)(1),
(2) Date: Feb. 16, 2018

(87) PCT Pub. No.: WO2017/027957
PCT Pub. Date: Feb. 23, 2017

(65) Prior Publication Data
US 2018/0240262 A1 Aug. 23, 2018

Related U.S. Application Data

(60) Provisional application No. 62/206,114, filed on Aug. 17, 2015.

(51) Int. Cl.
*G06T 19/00* (2011.01)
*G06F 19/00* (2018.01)
(Continued)

(52) U.S. Cl.
CPC .......... *G06T 13/80* (2013.01); *G06F 17/5018* (2013.01); *G06T 13/00* (2013.01); *G06T 13/20* (2013.01); *G06T 2210/21* (2013.01)

(58) Field of Classification Search
None
See application file for complete search history.

(56) References Cited

U.S. PATENT DOCUMENTS 8,902,234 B1 * 12/2014 Sanocki ................. G06T 13/00
345/473
8,902,236 B1 * 12/2014 Cohen Bengio ........ G06T 13/20
345/473

(Continued)

OTHER PUBLICATIONS

McAdams et al., "Efficient elasticity for character skinning with contact and collisions", ACM Transactions on Graphics (TOG), vol. 30. No. 4, ACM, 2011.

(Continued)

*Primary Examiner* — Martin Mushambo
(74) *Attorney, Agent, or Firm* — Harness, Dickey & Pierce, PLC

(57) ABSTRACT

The present disclosure relates generally to computer graphics applications, and more particularly to systems and methods for implementing two- and three-dimensional computer graphics modeling and animation of deformable objects in a simulated environment. More preferably, the present disclosure relates to computer or visual graphics applications using finite-element based and other physically based modeling or simulation methods.

22 Claims, 1 Drawing Sheet

A. No collision response

B. Collision response that uses spring damping forces

C. Collision response that uses bilateral constraints

D. Collision response that uses the present invention

(51) Int. Cl.
   *G06T 13/80*   (2011.01)
   *G06F 17/50*   (2006.01)
   *G06T 13/00*   (2011.01)
   *G06T 13/20*   (2011.01)

(56) References Cited

U.S. PATENT DOCUMENTS

| | | | |
|---|---|---|---|
| 9,741,148 B2* | 8/2017 | West | G06T 13/40 |
| 10,022,628 B1* | 7/2018 | Matsumiya | A63F 13/577 |
| 2002/0196258 A1* | 12/2002 | Lake | G06T 13/40 |
| | | | 345/474 |
| 2003/0088389 A1* | 5/2003 | Balaniuk | G06F 17/5018 |
| | | | 703/2 |
| 2008/0043042 A1* | 2/2008 | Bassett | G06T 13/20 |
| | | | 345/646 |
| 2011/0216070 A1* | 9/2011 | Witkin | G06T 13/40 |
| | | | 345/442 |
| 2013/0187930 A1* | 7/2013 | Millman | G06T 13/20 |
| | | | 345/473 |
| 2013/0257856 A1* | 10/2013 | Hickman | G06T 13/20 |
| | | | 345/419 |
| 2014/0172388 A1* | 6/2014 | Yamakawa | G06T 17/20 |
| | | | 703/2 |
| 2014/0198107 A1* | 7/2014 | Thomaszewski | G06T 13/40 |
| | | | 345/473 |
| 2015/0112653 A1* | 4/2015 | Wu | G06F 17/5009 |
| | | | 703/2 |
| 2015/0242546 A1* | 8/2015 | Jeon | G06F 17/5009 |
| | | | 703/2 |
| 2017/0351793 A1* | 12/2017 | Tamstorf | G06F 17/5018 |
| 2018/0089878 A1* | 3/2018 | Edwards | G06T 13/20 |

OTHER PUBLICATIONS

Teschner et al., "Collision detection for deformable objects", Computer Graphics Forum, vol. 24. No. 1, Blackwell Publishing Ltd., 2005.

Wang et al., "Deformation capture and modeling of soft objects", ACM Transactions on Graphics (TOG), vol. 34, Issue 4, Published Jul. 27, 2015, Article 94.

Debunne et al., "Interactive multiresolution animation of deformable models", Computer Animation and Simulation '99, Springer Vienna, 1999. pp. 133-144.

* cited by examiner

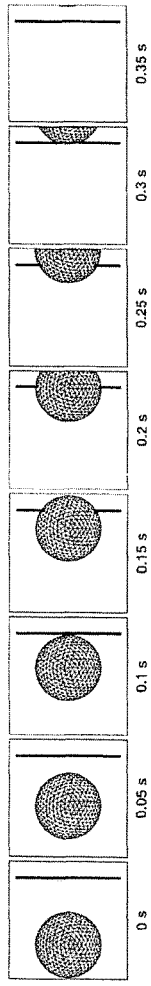
A. No collision response
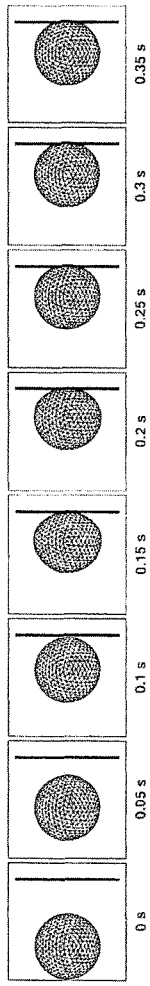
B. Collision response that uses spring damping forces
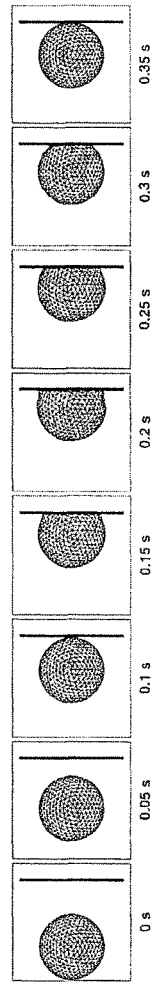
C. Collision response that uses bilateral constraints
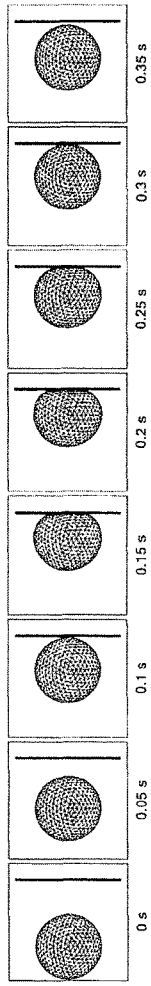
D. Collision response that uses the present invention

PHYSICALLY BASED SIMULATION METHODS FOR MODELING AND ANIMATING TWO-AND THREE-DIMENSIONAL DEFORMABLE OBJECTS

CROSS-REFERENCE TO RELATED APPLICATION

This application is a National Phase Entry of International Patent Application No. PCT/CA2016/000210, filed on Aug. 17, 2016, which claims priority to U.S. Provisional Patent Application Ser. No. 62/206,114, filed on Aug. 17, 2015, both of which are incorporated by reference herein.

TECHNICAL FIELD

The present invention relates generally to computer graphics applications, and more particularly to systems and methods for implementing two- and three-dimensional computer graphics modeling and animation of deformable objects in a simulated environment. More preferably, the present invention relates to computer or visual graphics applications using finite-element based and other physically based modeling or simulation methods.

BACKGROUND

Computer graphics (CG) or computer generated images (CGI) have become an integral part of today's film and video game making process. For example, performances that cannot be or may be too dangerous to be accomplished by human actors or stunt doubles may be made possible by using CG visual effects or CGI. The addition of two-dimensional (2D) or three-dimensional (3D) CGI to motion pictures, television shows, videogames or video advertisements can be done using computer-based simulations or modeling and software employing same. Examples of such include, but may not be limited to, object animation, including but not limited to characters (for example, through animated muscle, skin and fat), soft bodies, and colliding objects.

CG visual effects or CGI that are developed using computer-based simulations or models may be created using existing modeling and animation software, such as, for example, AUTODESK™, MAYA™, HOUDINI™, and others. As a further example, Digital Molecular Matter (DMM™), which is a technology available from Pixelux Entertainment, S.A. includes software to author 3D objects that have physical characteristics.

In computer-based modeling and animation, dynamic finite-element simulations may be used to obtain realistic looking, physically plausible deformations of objects. Some software packages for modeling and animation may include a solver based on a finite-element approach. A finite-element simulation may approximate a deformable solid object using a finite number of elements of finite complexity (e.g., tetrahedra or hexahedra). The positions and the deformations of these elements are controlled by nodes. By analyzing and integrating the densities of the mass and the internal and external forces over the elements, the positions and the velocities of the nodes may be simulated over time, resulting in an animation. Besides dynamic simulations, finite element methods may also be used to compute or approximate a static equilibrium, which may be used for modeling purposes.

Finite element methods and other force-based simulation methods can be tremendously important tools for animating scenes showing real-world, physically plausible behavior, for example in virtual reality applications or in computer animations for feature films. In computer graphics, surfaces or solid objects may be represented by triangle meshes, quad meshes or tetrahedral meshes, among other representations. When using finite-element simulation in the context of CGI, mesh vertices can be moved to desired positions on a frame-by-frame basis. The results of the simulation can be preferably read on a frame-by-frame basis. In conventional systems that are not based on simulation, model changes desired during animating or rendering an object may require a user to return to the geometric representation of the object and to modify the underlying geometry. This can be a meticulous, labor-intensive operation.

SUMMARY

Embodiment of the present invention are directed to computer-based methods, executable in a computer graphics system, for generating a physically plausible collision response within a simulation of the computer graphics system using an implicit integration scheme, that includes contact forces, and eliminates penetrations and prevents stickiness, the methods comprising; (a) a user defining a mass matrix (MM), a force model (FM), and a preconditioning operator (PO), wherein the force model may be a linear or nonlinear operator that defines a force vector for each combination of positions, velocities and time and the preconditioner may be a matrix or a linear operator that may be used to obtain a vector from another vector; (b) the user specifying a user-defined accuracy (UDA), wherein the UDA is a threshold value to determine when a solution has been reached; (c) initializing a current approximation (CA) of the solution of the implicit integration scheme; (d) using Equations 13, 8 and 3, initializing an enabled set (ES) wherein the ES is a set of all contact indices that have a nonpositive signed distance at the CA; (e) modifying the CA so that none of the contact constraints in the ES are being penetrated in accordance with Equations 33 and 34; (f) initializing a previous polyline search direction (PSD) to a zero vector; (g) setting a segment index (SI) to one; (h) conducting a polyline search to modify the ES, the CA and the SI to improve the accuracy of the CA without introducing any penetrations and to obtain a current search direction (CSD); (i) making the PSD equal to the CSD that resulted from the polyline search; and (j) until the SI is one, repeat all the steps starting at (g).

Preferred embodiments of the present invention are directed to computer-based methods, executable in a computer graphics system, wherein the above noted method is conducted for a single time interval. More preferred embodiments of the present invention are directed to computer-based methods, executable in a computer graphics system, wherein the method is conducted for a plurality of time intervals. More preferred embodiments of the present invention are directed to computer-based methods, executable in a computer graphics system, wherein step (c) further comprises setting the initial coordinates of the CA as any set of numbers. More preferred embodiments of the present invention are directed to computer-based methods, executable in a computer graphics system, wherein step (c) of the above method further comprises solving the implicit integration scheme without incorporating collisions to obtain the initial coordinates of the CA.

More preferred embodiments of the present invention are directed to computer-based methods, executable in a computer graphics system, wherein step (h) noted above further comprises: (i) computing a projected previous search direction (PPSD) from the PSD and the ES in accordance with Equations 38 and 39; (ii) where the SI equals 1, removing from the ES each contact index for which an normal multiplier as defined from the CA by means of Equation 32 is nonpositive; (iii) computing a current residual (CR) in accordance with Equation 23, making use of the MM, the FM, the ES and the CA; (iv) computing a base search direction (BSD) by pre-multiplying CR with the inverse of the PO; (v) where a dot product of the CR and the BSD is less than or equal to the UDA, then continue at step (i) noted above.

More preferred embodiments of the present invention are directed to computer-based methods, executable in a computer graphics system, wherein step (v) of the above noted method further comprises: (A) where a dot product of the CR and the BSD is greater than the UDA, computing the current search direction (CSD) as a linear combination of the PPSD and the BSD; (B) where the dot product of the CR and the CSD is negative, then negating the CSD; (C) finding an optimal search parameter (OSP) which is the smallest positive number that satisfies Equation 44 or a positive approximation thereof; (D) determining the set of hit parameters (HP), which consists of all positive parameters that are less than or equal to the OSP and that can be obtained from Equation 47 from contacts that are not in ES; (E) where the HP is empty, then setting the current search parameter (CSP) equal to the OSP, else set the CSP to the minimum of all parameters in the HP; (F) updating the CA based on the CSP using Equation 43; (G) inserting into the ES each contact index that has a nonpositive signed distance at the CA, according to Equations 13, 8 and 3; and (H) incrementing the SI by one; (I) where the HP is empty, then executing the steps starting at step (i) of claim 1; and (J) repeating all the steps starting at step (i) of the above noted method.

More preferred embodiments of the present invention are directed to computer-based methods, executable in a computer graphics system, wherein step (B) noted above may further comprise computing a current search direction (CSD) as a linear combination of the PPSD and the BSD in accordance with Equations 40 and 41. More preferred embodiments of the present invention are directed to computer-based methods, executable in a computer graphics system, further comprising (k) computing a normal-force multiplier tuple (NMT) from the ES and the CA in accordance with Equation 32; and (l) computing a second CA by solving the system of Equation 48, where the ES and the NMT occur as constants. More preferred embodiments of the present invention are directed to computer-based methods, executable in a computer graphics system, further comprising: (m) modifying the CA so that none of the contact constraints in the ES are being penetrated in accordance with Equations 33 and 34.

More preferred embodiments of the present invention are directed to computer-based methods, executable in a computer graphics system, where the entire sequence of steps is executed a user-specified number of times, wherein after each execution a total contact force, as determined by Equation 22, and using a zero vector for a tangent multiplier tuple is added to F. More preferred embodiments of the present invention are directed to computer-based methods, executable in a computer graphics system, wherein the entire sequence of steps is executed using a user-specified number of times, where after each execution a total contact force, as determined by Equation 22, is added to F.

More preferred embodiments of the present invention are directed to computer-based methods, executable in a computer graphics system, wherein step the entire sequence of steps is executed a user-specified number of times, where after each execution a total contact force, as determined by Equation 22, is added to F.

More preferred embodiments of the present invention are directed to computer-based methods, executable in a computer graphics system, for avoiding unnecessary collision detections for a moving or deforming plurality of geometric primitives in a computer simulation, the method comprising: (a) creating an augmented binary tree data structure wherein each node represents a moving, deforming region in space, using the steps described in Table 4; (b) identifying a set of all geometric primitives with which potential collisions may occur, using the tree data structure of Step (a) as described in Table 5, for each simulated geometric primitive; and (c) conducting continuous collision detection tests on all potentially colliding pairs of geometric primitives that were identified in Step (b).

More preferred embodiments of the present invention are directed to computer-based methods, executable in a computer graphics system, for computing a rigid prediction of a motion of a deformable body in a computer simulation, the deformable body having a plurality of nodes as an initial approximation in an integration scheme, the method comprising: (a) computing a linearization of the external force (LEF), using a start position vector and a start velocity vector at a first time point, which consists of an external force vector, a matrix of all first partial derivatives of the external force vector in the position variables, and a matrix of all first partial derivatives of the external force vector in the velocity variables; (b) computing a first end acceleration vector (FEA), using the LEF, by solving the linear system of Equation 64; (c) computing a first end position (FEP) and a first end velocity (FEV), using the FEA, according to Equation 2 at a second time point; (d) computing a center of mass (CMF) of the deformable body at the first time point; (e) computing a center of mass (CMS) of the deformable body at the second time point, using the FEP; (f) computing a linear momentum (LM) of the deformable body at the second time point, using the FEV; (g) computing an angular momentum (AM) of the deformable body at the second time point, using the CMS, the FEP and the FEV; (h) computing an angular velocity (AV) of the deformable body at the second time point, using the CMF and the AM, by solving Equation 73; (i) computing a rotation matrix (RM) at a second time point, using the AV, according to Equations 70 and 71; (j) computing a global position vector at the second time point using the CMF, LM and the RM, according to Equation 75; and (k) computing the global velocity vector at the second time point, using the RM and the LM, according to Equation 76.

More preferred embodiments of the present invention are directed to computer-based methods, executable in a computer graphics system, for determining a deformation and a topology of a first mesh having a plurality of geometric primitives in a computer simulation, based on a deformation of a second mesh having a plurality of tetrahedra that may have a different topology from the first mesh, the method comprising: (a) a user defining a simulated reference mesh (SRM) having a plurality of tetrahedra, an embedded reference mesh (ERM) having a plurality of geometric primitives and a current simulated mesh (CSM) having a plurality of tetrahedra; (b) initializing a correspondence between the plurality of geometric primitives of the ERM and the plurality of tetrahedrons of the SRM to obtain for each geometric primitive of the ERM a corresponding primitive parent (PP); (c) computing a reference region (RR), which is a convex hull of all corners of a tetrahedron, for each tetrahedron of the SRM; (d) determining a corner location (CL) for each primitive corner of the ERM, wherein the CL is an index of a primitive in the SRM in a neighborhood of the corresponding primitive parent that minimizes a signed distance of the position of the primitive corner in the ERM to the RR; (e) determining a vertex location (VL) for each vertex of the current embedded mesh (CEM) by selecting a lowest-indexed corner that maps to that vertex and choosing the corresponding VL to be the CL of that corner; and (f) computing a position for each vertex of the CEM using the VL of that vertex and the plurality of vertex positions in the CSM.

More preferred embodiments of the present invention are directed to step (b) which further comprises: (i) computing a reference centroid (RC), which is an average of the vertex positions of a geometric primitive, for each geometric primitive of the ERM; and (ii) determining the primitive parent (PP), which is a simulated primitive whose corresponding RR has a minimal signed distance to the RC, for each geometric primitive of the ERM.

More preferred embodiments of the present invention are directed to step (f) which further comprises: (i) computing a weighted average of deformation gradients (ADG) of all adjacent tetrahedra, for each vertex of the CSM; (ii) computing a corner weight (CW) and a vector of first partial derivatives of weights (CDW), for each corner of each primitive of the CEM; and (iii) computing the current position as a weighted average of current positions given by Equation 81 for each vertex of the CEM.

More preferred embodiments of the present invention are directed to step (ii) as noted above which further comprises: (A) computing the corner weight (CW) and the vector of partial derivatives of the corner weight (CDW) for each corner of each primitive of the CEM, where the corner weights may be prescribed by Equation 78.

More preferred embodiments of the present invention are directed to step (f) which further comprises: (i) computing a weighted average of time derivatives of deformation gradients (ATDG) of all adjacent tetrahedral, for each vertex of the CSM; (ii) computing the current velocity as a weighted average of current velocities given by Equation 82 for each vertex of the CEM.

More preferred embodiments of the present invention are directed step (f) which further comprises: (i) computing a vertex deformation gradient (VDF) as a weighted average of the ADGs of all corners that map to the same vertex of the CEM, for each vertex of the CEM; and (ii) computing the current normal using the VDF of the vertex of a corner and the normal of that corner in the ERM, for each corner of the CEM.

More preferred embodiments of the present invention are directed to between steps (d) and (e) comprising: (i) setting an available vertex index (AVI) to one; (ii) performing Steps (iii) to (vii), for each embedded reference vertex (ERV) of the ERM, and terminate; (iii) determining a set CI of corner indices that map to the ERV; (iv) determining a set LCL that consists of all CL for all corners in CI; (v) determining a number of unique corner locations (NUCL), by counting the number of distinct elements of the LCL; (vi) assigning a distinct local vertex index (LVI) that must lie between AVI and AVI plus NUCL minus 1, to each CL in the NUCL; and (vii) to each corner of the LCL, creating an associated vertex for the CEM, whose index is the LVI of that corner's CL.

BRIEF DESCRIPTION OF THE DRAWINGS

FIG. 1A to 1D illustrate aspects of the present invention.

DESCRIPTION OF THE PREFERRED EMBODIMENTS

The description that follows, and the embodiments described therein, is provided by way of illustration of an example, or examples, of particular embodiments of the principles and aspects of the present invention. These examples are provided for the purposes of explanation, and not of limitation, of those principles and of the invention.

It should also be appreciated that the present invention can be implemented in numerous ways, including as a process, method, an apparatus, a system, a device, a method, or a computer readable medium such as a computer readable storage medium or a computer network wherein program instructions can be sent over a network (e.g., optical or electronic communication links). In this specification, these implementations, or any other form that the invention may take, may be referred to as processes. In general, the order of the steps of the disclosed processes may be altered within the scope of the invention.

Preferred embodiments of the present invention can be implemented in numerous configurations depending on implementation choices based upon the principles described herein. Various specific aspects may be disclosed, which can be illustrative embodiments not to be construed as limiting the scope of the disclosure. Although the present specification describes components and functions implemented in the embodiments with reference to standards and protocols known to a person skilled in the art, the present disclosures as well as the embodiments of the present invention are not limited to any specific standard or protocol. Each of the standards for computing (networked or otherwise), including the internet and other forms of computer network transmission (e.g., TCP/IP, UDP/IP, HTML, and HTTP) represent examples of the state of the art. Such standards may be periodically superseded by faster or more efficient equivalents having essentially the same functions. Accordingly, replacement standards and protocols having the same functions may be considered equivalents.

Elements of the present invention may be implemented with computer systems which may be well known in the art. Generally speaking, computers include a central processor, system memory, and a system bus that couples various system components including the system memory to the central processor. A system bus may be any of several types of bus structures including a memory bus or memory controller, a peripheral bus, and a local bus using any of a variety of bus architectures. The structure of a system memory may be well known to those skilled in the art and may include a basic input/output system (BIOS) stored in a read only memory (ROM) and one or more program modules such as operating systems, application programs and program data stored in random access memory (RAM). Computers may also include a variety of interface units and drives for reading and writing data. A user or member can interact with a computer with a variety of input devices, all of which are known to a person skilled in the relevant art.

Embodiments of the present invention can be implemented by a software program for processing data through a computer system. It will be understood by a person skilled in the relevant art that the computer system can be a personal computer, mobile device, notebook computer, server computer, mainframe, networked computer (e.g., router), workstation, and the like. In one embodiment, the computer system includes a processor coupled to a bus and memory storage coupled to the bus. The memory storage can be volatile or non-volatile (i.e., transitory or non-transitory) and can include removable storage media. The computer can also include a display, provision for data input and output, etc. as will be understood by a person skilled in the relevant art.

Some portions of the detailed descriptions that follow are presented in terms of procedures, steps, logic block, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc. may be here, and generally, conceived to be a self-consistent sequence of operations or instructions leading to a desired result. The operations are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers or the like.

It should be borne in mind that all of the terms used herein may be associated with the appropriate physical quantities and may be merely convenient labels applied to these quantities. Unless specifically stated otherwise as apparent from the following discussions, it will be appreciated that throughout the present invention, discussions utilizing terms such as "receiving," "creating," "providing," or the like may refer to the actions and processes of a computer system, or similar electronic computing device, including an embedded system, that manipulates and transfers data represented as physical (electronic) quantities within the computer system's registers and memories into other data similarly represented as physical quantities within the computer system memories or registers or other such information storage, transmission or display devices.

The term CG visual effects or CGI refers to at least one computer-generated 2D or 3D simulation or model, which may be animated, that uses a collection of geometric data (e.g., Cartesian), a description of object surfaces, cameras and lights to represent a scene in 2D or 3D space. Examples of CG 3D visual effects include, but are not limited to, a combination of computer generated 3D models, computer generated 3D models with animation and/or procedural effects such as smoke, dust and fire, as well as, computer generated 3D models that can be physically simulated.

It will be further understood by a person skilled in the relevant art that the term "animation" refers to the temporal description of a CG 2D or 3D visual effect. The temporal description of an object defines how it moves, deforms and interacts over time.

It will be further understood by a person skilled in the relevant art that the term "digital video" refers to a series of one or more orthogonal bitmap digital images displayed in rapid succession at a constant rate. In the context of video, these images may be referred to as frames.

The word "frame" may also be used to indicate a point in time that corresponds to a single image in a series of images that constitute a digital video. A frame may also refer to a particular time in an animation or a simulation. Each of the objects in a scene may have a prescribed position and deformation for a given frame. For each such a frame, a digital image may be eventually rendered.

It will be understood that, in the present description, a user may be a person (i.e., an artist) or may be another piece of software or hardware interacting with the embodiments of the present invention. The term "user" may refer to a person that employs the invention by manipulating a graphical interface or a text-based interface for a software implementation of the invention. However, for the purposes of this invention, the term "user" may also refer to another machine, another computer program or another part of the same computer program that interfaces with the invention in order to obtain its results and further process these results. For example, a renderer may provide the inputs for the present invention, which may consist of one or more input meshes, a set of physical parameters, accuracy thresholds, etc. The deformed output meshes that are produced by the present invention may then be used by the renderer to generate digital images.

It will be understood by a person skilled in the relevant art that a graphics creation engine may be used which can be operative to receive user inputs, such as through a graphical user interface ("GUI") or any other interface. Such graphics creation engines access and function in conjunction with instructions to a conventional computer graphics representation and manipulation module. The graphics representation and manipulation module manipulates the fundamental constructs representing the modeled entity in various stages of an animation process. The modeled entity (e.g., object) is available for display to a user on a video display monitor. It will be understood that each element could be done separately or individually over a network where different aspects can be accomplished by different networked computers or processes.

A "deformable object" may be an object that is deformed by modifying individual vertex positions or by specifying global transforms (e.g., scaling and shearing transforms) that are associated with the object. The deformation of a deformable object may occur in the course of a simulation or an animation.

The terms "model" and "geometry" may refer to a geometric representation or an approximation of a shape in 2D or 3D. A model may be represented by a mesh, for example. In addition to a mesh, a model may also have other representations, for example a voxel-based representation or an implicit surface representation.

The term "rendering" may refer to the process of generating digital images from a representation of a scene. A scene may consist of one or more objects, but it may typically have additional elements such as lights and cameras. For the present invention, a scene may include various types of objects, for example, rigid objects and deformable objects. The rendering process may be a pipeline of stages, of which the final results may consist of two-dimensional or stereoscopic images.

An "object" may consist of a model and an associated position and/or transformation in two-dimensional or three-dimensional space. In addition, an object may have associated with it data that is needed for rendering purposes, for example color information, textures and shaders. Furthermore, an object may have associated with it data that is required for simulation purposes, including, but not limited to, mass density, elasticity coefficients, damping coefficients, and air drag coefficients.

An aspect of the present invention involves the use of mathematical techniques for simulating or modeling objects and their movements and interactions in a computer-created (e.g., simulated) environment, as well as associated software implementations thereof, for determining visually plausible simulated movements and interactions (e.g., collisions, deformations, etc.) of an object, its surface and interactions with itself and other objects. As used herein, the term "surface" may be used to refer either to an actual surface within a 3D computer model, or the projection of a physical surface within a 2D image. When used in conjunction with suitable rendering software, the calculated simulation allows for visually plausible simulated movement and interaction of an object or its surface in a realistic or visually plausible way such that a casual viewer (or user of the software) would imagine that the object was real and not, in actual fact, a representation of such an object in a simulated or modeled environment.

In accordance with one embodiment of the present invention, there is provided the application of specific mathematical and computer software techniques to the problem of plausibly visually representing the movement and interaction of objects with other objects or with themselves and in a specific simulated environment, including object collisions, in manner that is efficient in time and effort.

Advantageously, embodiments of the present invention allow for user-specified constraints and/or physics-based constraints to be used to generate visually realistic or plausible interactions of objects in an environment with a minimum of skill, effort, time and cost. Embodiments of the invention enable a wide range of visually important features to be replicated in order to enhance the realistic or plausible nature of the final image or animation.

It will be understood by a person skilled in the relevant art that visually realistic or plausible representations in a simulated environment can be those that would be seen by a viewer or user of the simulated environment to be a sufficiently accurate representation so as to be understood by the user/viewer to be realistic or plausible interactions or movements of object(s) in the real (not the simulated) environment.

The term simulation may refer to a systematic sequence of computation steps (e.g., an algorithm) that is intended to compute or approximate the results of a physical process. In the context of the present invention, simulations may be performed that are based on the mechanics of deformable objects, rigid objects and the interaction between these objects. A static simulation may consist of computing or approximating a configuration (e.g., a position for each vertex of a mesh that represents an object) such that all the forces that act on the object are in equilibrium. A dynamic simulation may consist of steps where the goal is to approximate the equations of motion of a mechanical system that involves deformable objects and rigid objects.

It is contemplated that the invention has various commercial applications, including software for modeling texture, shape, interaction and movement. In addition, the invention may be applied in support of product design and design modification of products for modeling interactions in an environment, which can be important design considerations.

It will be further understood by a person skilled in the relevant art that the steps of the processes described herein may be further divided into sub-steps.

A person skilled in the relevant art will understand that the term "geometric primitive" or "primitive" typically, but not necessarily, refers to geometric elements such as polyhedra, tetrahedral ("tets"), polygons, quadrilaterals ("quads"), triangles, polylines, line segments, isolated vertices and pluralities of isolated vertices.

Within the context of this invention, the term "corner" may refer to the location of a vertex on a designated geometric primitive such as a line segment, a polygon, a tetrahedron or a polyhedron. For example, two triangles in a mesh could have a common vertex, but two triangle corners that correspond to two distinct geometric primitives that share a position with this vertex could be considered distinct entities. Each corner may have exactly one associated vertex.

The term "vertex" may refer to a mathematical entity that may have an associated position in 2D or 3D space. Multiple vertices may share the same position in space. In addition to an associated position, each vertex may optionally have other data associated with it, such as a velocity vector and a normal vector. In the context of animation, the same vertex may occur in multiple animated frames, at different positions. It may be expedient to identify a vertex in a mesh with the set of all corners of geometric primitives in the mesh that refer to it.

The term "tetrahedron" may refer to a geometric primitive that has four corners. A tetrahedron may describe a region in 3D space that is the convex hull of the positions of its four corner vertices. In the context of animation and simulation, the same tetrahedron may occur in multiple meshes, while having different positions at its four corner vertices in these meshes.

A person skilled in the relevant art will understand that the term "mesh" typically, but not necessarily, refers to a collection of geometric primitives. Distinct geometric primitives in a mesh may share common vertices. For example, two corners belonging to distinct primitives may share a common vertex. A mesh may define a shape of an object.

A person skilled in the relevant art will generally understand that the term "tetrahedral mesh" or "tet mesh" refers to a mesh in which all geometric primitives are tetrahedrons. A tetrahedral mesh can be used to represent a solid object in three-dimensional space. Such representations may be used in the simulation of deformable solid objects, of which finite-element simulation may be an example.

A person skilled in the relevant art will understand that the term "triangle mesh" refers to a mesh in which all geometric primitives are triangles. A triangle mesh may be used to represent or approximate the surface of a solid object. However, not every triangle mesh necessarily represents the surface of a solid. If a triangle mesh does represent the surface of a solid, then it may be possible to generate a tetrahedral mesh for the same solid, whose surface coincides with that triangle mesh. The process of generating a tetrahedral mesh from a triangle mesh may be referred to as "tetrahedralization".

A person skilled in the relevant art will generally understand that the term "quadrilateral mesh" or "quad mesh", but not necessarily, refers to a mesh in which all geometric primitives are quadrilaterals.

The term "mesh resolution" may refer to the density of geometric primitives in a mesh per unit of area or unit of volume. Sometimes the term "mesh resolution" may also refer to the total number of geometric primitives or the total number of vertices in a mesh.

The term "deformation" may refer to a change in shape of an object. A deformation may be defined by an assignment of positions to all vertices in a mesh. A "pose" may be designated deformation of an object that may be used in an animation. In the context of animation, the term "base pose"

may refer to a specific pose that may be used to define a correspondence between bones that control the animation and the vertices of the animated mesh. Within the context of the present invention, a base pose may also mean a pose that is used to establish a correspondence between two meshes, for example, between a low-resolution simulation mesh and a high-resolution rendering mesh.

The "topology" of a mesh, or "mesh topology" may refer to the connectivity between the geometric primitives in the mesh. The topology may define which geometric primitives may have vertices in common. More specifically, within the context of this invention the term "mesh topology" may refer to a table that assigns a vertex to each corner of each geometric primitive in the mesh.

The term "fracturing" may refer to the process of separating geometric primitives in a mesh based on physically based criteria such as exceeding internal stress thresholds. In the context of the present invention, fracturing may usually mean the process of deciding whether a set of corners that share a single common vertex should no longer be connected and share a plurality of vertices instead. This process may add new vertices to an existing mesh.

In computer-based simulation or modeling, physics simulation may be used as a tool to create visual effects or visual special effects (VFX) for movies, commercials and video games. The results of such physics simulations are used to generate a sequence of digital images, which can be joined together to form an animation or a movie clip. Embodiments of the present invention are directed to simulations of deformable objects. In addition to simulating the deformation of objects in isolation, these embodiments of the present invention are directed to the realistic simulation of collision responses and, in preferred embodiments, fracturing. The embodiments of the present invention include, but are not limited to, physically-based simulation commonly referred to as "finite elements" (FE), the "finite element method" (FEM) or "finite element analysis" (FEA). Examples of finite element simulation in VFX include, but are not limited to, the simulation of muscles and skin, enhancing the realism of character animations, the simulation of collapsing structures (e.g., buildings and bridges), the breaking of wood and the like.

One skilled in the relevant art would understand that the term "node" as used herein may refer to a vertex of a mesh that is part of simulation, such as, a finite element simulation. In a preferred embodiment, a node can refer to a vertex of a geometric primitive. Within the context of simulation, each node may have associated with it both a triple of position coordinates (e.g, X, Y and Z) and a triple of velocity coordinates.

One skilled in the relevant art would understand that the term "tree node" may refer to a datum or data in a tree data structure. The term "tree node" should not be confused with the term "node", which is understood by a person skilled in the relevant art to generally have a distinct meaning in the context of finite element simulations.

It will be further understood by a person skilled in the relevant art that the term "constraints" typically, but not necessarily, refers to demarcations or delimiters of geometrical characteristics between two or more objects within a computer model or simulation. These delimiters can be intentional in defining properties of theoretical physical position and motion, or displacement of the applicable object. The purpose of constraints in a model or simulation is typically, but not necessarily, to control and limit the behavior of an object in a model or simulation in relation to other objects in the same model or simulation.

A person skilled in the relevant art would understand that the terms "computer modeling" and "simulation" may refer to an attempt to model a real-life or hypothetical situation on or in a computer created environment so that it can be studied to see how the system works or to replicate the actions or behaviours of objects in such an environment. A person skilled in the relevant art would understand that there are a number of existing methods for modeling or simulating objects in a computer environment. For example, one skilled in the relevant art would appreciate that constraint-based modeling can be computer-based modeling of solid objects that allows specification of constraints (e.g., user derived or physics derived) that parts of the model have to satisfy. Other simulations or modeling systems are well known. Modeling can also be understood as a 2D or 3D representation of a real or imagined object using, for example, using polygons.

One skilled in the relevant art would understand that the term "solver" can be a reference to an element or piece of mathematical software, possibly in the form of a stand-alone computer program or as a software library, that solves a mathematical problem. A person skilled in the relevant art would understand a solver to take problem descriptions in some sort of generic form and calculates their solution.

The term "collision detection" may refer to the process of determining whether two geometric primitives intersect at a given time or whether two moving geometric primitives may collide within a specified time interval.

The term "collision resolution" refers to the process of computing a displacement or a physical response for the geometric primitives involved in a detected collision. The purpose of the collision response may be to ensure that the geometric primitives become separated. An additional purpose of a collision response may be to realistically approximate the effects that a collision would have on physical objects.

In a preferred embodiment, a finite element solver, such as, but not limited to, that found in HOUDINI™, may contain numerical algorithms that have been developed for collision resolution, collision detection, integration, and animation transfer.

In a preferred aspect of the present invention, a finite-element simulation may involve at least one collision. It will be understood that collisions may occur with external objects (e.g., the ground), with other finite-element objects, or between parts of a single object (self-collisions). A finite element model of the object can be generated using, for example, using tetrahedralization of a triangle mesh. An irregularly shaped object can be divided into smaller regular finite elements. Each element can then be treated separately and the aggregate effect can be the sum of the effects of all of the finite elements in the object. The finite element model can be created by a user using an appropriate software package that operates on known geometric models. Some integrated software packages link modules for geometric modeling and finite element analysis so that the user does not have to redefine the geometry specifically for finite element analysis.

Computer 3D models of objects may comprise the outer shell of that object. In contrast, solid modeling represents an object as a solid mass of small 3D tetrahedra. An aspect of control of the process can be a spatial decomposition, which can be effectively breaking down objects into smaller discrete elements spatially. In the context of simulating using FEM, the number and size of these tetrahedra may be based on the level of accurately that can be dictated by the user. Each of these tetrahedron individually deform which, when the deformation of the individual tetrahedra can be taken together, result in the object appearing to deform. The tetrahedra allow users to simulate the internal strains and stresses. This lets a solver realistically simulate bending, elasticity, internal mass, chipping, crumbling, and shattering. Solid objects can simulate stiff materials (like metal or wood), or elastic, rubbery, fluid, and floppy objects (like muscle and fat). In the user interface (e.g., the GUI), a pull down menu may refer to an object class or type (e.g., a solid object) which can then be used to represent or "create" a solid object in the simulation or model. This solid object can then be provided to a finite element solver which can simulate the animation of the object. In a similar fashion, this solver may also be used to simulate the animation (e.g., movement or interaction of the object with itself or other objects) of cloth or fabric objects (e.g., clothing, furniture, caps, dress, etc.).

An embodiment of the present invention is controlling the accuracy level and stability of that simulation through temporal discretization or breaking down the simulation or model into discrete time steps or increments. Generally, the greater the degree of temporal discretization the more accurate or realistic the simulation or modeling of realistic or plausible movement within the simulated environment, which may allow for a higher degree of control over the animation. This parameter of temporal discretization in a solver of the present invention (e.g., as provided in HOUDINI™) may be referred to as "Minimum Substeps" (or "Min Substeps", for short). If a user has a simulation, for example, where the amount of movement from time frame to time frame can be large compared with the sizes of the tetrahedra, a person skilled in the art may need to increase the "Minimum Substeps" to get more accurate and more stable results.

A preferred embodiment of the combined solver can be an optimization algorithm that may be able to approximate a solution with any desired accuracy, as described herein.

In most types of deformable-object simulations (e.g., simulations involving non-fluid objects, typically an elastic object that recovers its shape, as opposed to a rigid object that does not), the performance bottleneck can be collision detection. The solver may spend a significant proportion of its time determining which pairs of geometric primitives (e.g., triangles or tetrahedra) would be colliding.

When an implicit integration step can be used for finite element simulation, the nonlinear system of forces that act on the FEM nodes can be linearized, resulting in a linear system of equations. Some existing approaches use the state (the node positions and velocities) at the start of the time step as the Taylor center of the linearization. This can be highly inaccurate for objects that are stiff or objects that rotate fast (as often occurs in fracturing sims). Fully implicit systems use successive predictions of the state at the end time as the Taylor center. This can be expensive in terms of solve time and this approach tends to become unstable at large substeps. Instead, a preferred embodiment comprises a finite element solver such as, but not limited to, that found in HOUDINI™, that may incorporate an implicit rigid body solve step—consistent with the implicit integration scheme—to predict the end state as it would be if the deformable FEM object was a rigid object. This predicted end state is subsequently used as the center of the linearization, resulting in stable simulation of fast spinning, stiff objects at large substeps at a low simulation cost.

It can be often advantageous to use a lower resolution tetrahedral mesh (a simulated mesh) for direct simulation and transfer the resulting motion to a higher resolution mesh (an embedded mesh) that can be suitable for rendering. This reduces the simulation time and it also allows the use of the meshes that can be optimized for simulation. Finite element solvers such as DMM™ may use barycentric coordinates to deform the hi-res mesh along with the low-res tetrahedral mesh. This approach may have the drawback of introducing visible artefacts in the higher resolution mesh along the tetrahedral vertices, edges and faces of the lower resolution mesh. In a preferred embodiment, a finite element solver such as, but not limited to, that found in HOUDINI™, an approach is used that interpolates the positions of the lower resolution mesh. This means that coarse (e.g., lower resolution) simulated tetrahedra can be used with finer (e.g., higher resolution) rendered tetrahedra without introducing visible discontinuities.

The smooth embedding approach of the present invention supports fracturing as well. The higher resolution mesh can be fractured along with the lower resolution mesh. The parts of the higher resolution mesh that are not fractured may still appear smooth, without noticeable artefacts, when said approach is applied.

In a preferred embodiment, the approach to simulation can be analytical, rather than vectorial; the entire linearized system of equations according to the implicit integration scheme can be expressed by a single scalar-valued function whose value should be minimized, subject to constraints, to obtain a solution to the equations. Such an objective function depends on the node accelerations and the contact force multipliers at the end time of each sub-step.

Finite-element simulation may be used both for modeling and for animation: A dynamic finite element simulation can be used to create a physically plausible animation of objects. In modeling, finite element simulation can be used to create realistic deformations of objects. Some animation software packages include a finite-element based simulator, which can simulate the actions of any number of deformable objects. FEM may be a technique for finding approximate solutions to boundary value problems for partial differential equations. It uses subdivision of a whole problem domain into a finite number of simpler parts, called elements. Analogous to the idea that connecting many tiny straight lines can approximate a larger circle, FEM encompasses methods for connecting many simple element equations over many small subdomains or finite elements to approximate a more complex equation over a larger domain.

Embodiments of the present invention which employ finite element simulations yield results that are more realistic and more predictable than those that are based on particle systems (e.g., mass-spring systems). In contrast to other prior art methods, including, for example, spring-based systems, the behavior of finite element simulations remains consistent as the mesh resolution increases and the local shapes of the individual polygons and tetrahedra are modified. One of the goals of the embodiments of the present invention may be to perform finite element simulation in a way that achieves superior quality simulations, but at a reduced resource cost. A person skilled in the relevant art will understand that reduced resource costs can include, but may be not limited to, less computation time, energy, money, etc. than may be required by other finite element simulation systems.

The reduced resource costs and other benefits of an embodiment of the present invention may be achieved through embodiments of the present invention, including processes, methods, algorithms, systems and the like, that provide for one or more of the following: (1) more accurate collision responses at larger integration time steps; (2) faster collision detection between moving objects (4D data structure for acceleration collision detection); (3) more stable simulation with stiff objects (implicit rigid prediction); and (4) better quality transfer of deformation to higher resolution meshes (smooth embedding with fracturing support). The preferred embodiments of the present invention may allow a user to produce realistic simulations in less time than other prior art simulation systems and methods. The reduced simulation times may imply that a user who uses the embodiments of the present invention may spend less time developing the most preferred parameter settings for a particular desired result, thus resulting in an improvement of the user's productivity. When simulations are performed on a large scale, involving many computers on a network for example, the improved trade-off between quality and efficiency of the embodiments of the present invention may translate into resource savings or reduced resource costs (e.g., energy, time, money etc.).

An aspect of the present invention allows multiple deformable bodies to be simulated simultaneously in a more resource-efficient manner. Each of these bodies is allowed to move, rotate and deform. Continuous deformable bodies (objects) are approximated using meshes. The common vertices that connect the geometric primitives in a simulated mesh are called nodes. The nodes of this system are assigned contiguous indices in the range 1, ..., N, where N is the total number of nodes of all simulated deformable bodies. The positions of all the simulated bodies at any given time are represented by a single 3N-dimensional column vector x. Within the context of an embodiment of the present invention, this vector is called the global position vector.

The configuration space of the system consists of all 3N-dimensional global position vectors x. For each node index i in 1, ..., N, the 3-dimensional column vector $x_i$ specifies the position of the ith node. Each vector $x_i$ consists of the components of x at the coordinate indices 3i-2, 3i-1, and 3i. That is, $$x_i = \begin{pmatrix} x_{3i-2} \\ x_{3i-1} \\ x_{3i} \end{pmatrix}$$

The velocities of all nodes at a given time are specified by a single global velocity vector v, which is again a 3N-dimensional column vector. The state of the physical system at any time is represented by the pair (x, v). The same coordinate indices are used to represent a global acceleration vector a and a global force vector f as well.

The motion of all the objects may be modeled as a single system of differential equations $$Ma(t) = f(x(t), v(t), t), \quad (1)$$
$$v(t) = \frac{d}{dt}(x(t)),$$
$$a(t) = \frac{d}{dt}(v(t)),$$

where M is a 3N×3N global mass matrix, and f is a 3N-dimensional global force vector that depends on the global position vector x, the global velocity vector v and time t.

An embodiment of the present invention does not require that M is a diagonal matrix, as is the case for existing collision-response methods that concentrate all mass at the nodes. For example, an embodiment of the present invention may be used to simulate systems where the M is derived from uniform mass distributions over the tetrahedra. However, an embodiment of the present invention may assume that the mass matrix M is both symmetric and positive definite.

In general, the system of Equation 1 may not be solved analytically. In practice, a solution may need to be approximated through numerical methods. To get a numerical approximation, multiple discrete integration steps can be performed over successive time intervals, each with duration $\Delta t$. Each such integration step takes a start state ($x^n$, $v^n$) that corresponds to the start time $t^n$ and produces an end state ($x^{n+1}$, $v^{n+1}$) that corresponds to the end time $t^{n+1}=t^n+\Delta t$. Multiple successive integration steps may be performed where the end state of one step is used as the start state for the next step. This process can be applied to produce a sequence of states ($x^1$, $v^1$), ($x^2$, $v^2$), ..., ($x^L$, $v^L$) that may be used to render a physically based animation.

Preferred embodiments of the present invention are directed to dynamical physically based simulations of a given state of a deformable object at a given time. Using the preferred embodiments of the present invention, persons skilled in the relevant art (e.g., users) will be able to simulate realistically the motion and the deformation of each object as it proceeds from a first initial state onwards along time. For one embodiment of the present invention, a series of integration steps may be performed. In general, the most consistent results may be obtained when all of the integration steps have the same fixed time-step duration. As an illustration, a time step of 0.01 seconds may be used, starting from an initial point in time, say time $t^1$=0.00. Given the initial state ($x^1$,$v^1$) at time $t^1$=0.00, an integration step may be performed to obtain a second state ($x^2$,$v^2$) at time $t^2$=0.01. Using this second state ($x^2$,$v^2$) at time $t^2$=0.01, another integration step may be performed to obtain a third state ($x^3$, $v^3$) state at time $t^3$=0.02. By continuing in this fashion, a sequence of states ($x^1$, $v^1$), ($x^2$, $v^2$), ($x^3$, $v^3$), ..., ($x^L$, $v^L$) may be obtained corresponding to times $t^1$, $t^2$, $t^3$, ..., $t^L$, respectively.

From a sequence of states ($x^1$, $v^1$), ($x^2$, $v^2$), ..., ($x^L$, $v^L$) obtained from integration steps that correspond to times $t^1$, $t^2$, ..., $t^L$, respectively, a sequence of digital images may be rendered. These digital images (frames) may be joined together to create a digital video, which can be incorporated, by way of processes know to person skilled in the relevant arts, into feature films, commercials, computer games. Between each two adjacent frames, there can be one or more integration steps. The extra integration steps may be needed to increase the quality or the stability of the resulting animation. In this case, only a fraction of the states would be used to generate images. If, for example, a user wants to render a digital video that has 25 frames per second, then the user could use only the states ($x^1$, $v^1$), ($x^5$,$v^5$), ($x^9$, $v^9$), etc., that correspond to times=0.00, 0.04, 0.08, etc., assuming a fixed time-step duration of $\Delta t$=0.01. The states at times $t^2$, $t^3$, $t^4$, $t^6$, $t^7$, $t^8$, etc., can be discarded after the simulation has completed.

It will be understood by a person skilled in the relevant art that the smaller the duration of the time step that may be used for the simulation, the more integration steps need to be performed to create an animation of the same time length. In the example above, if a time step of 0.001 was employed instead of 0.01, it may be necessary to perform about 10 times the number of integration steps. Thus, a smaller integration time step leads to more integration steps, which leads to an increased use of resources. The larger the time step that can be used for each integration step, the less resources are required to generate an animation of a fixed duration.

The integration scheme determines how the end state $(x^{n+1}, v^{n+1})$ of a step is computed from the start state $(x^n, v^n)$ of that same step and possibly, from earlier states as well. An embodiment of the present invention can be used in combination with a variety of existing implicit integration schemes. These include, but are not limited to, well known and widely used schemes such as (first-order) Backward Euler, Newmark and second-order Backward Euler.

Preferred embodiments of the present invention use the acceleration $a=a^{n+1}$ that corresponds to the end time of the step to represent the solution of the step; the end position $x^{n+1}(a))$ and the end velocity $v^{n+1}(a)$ are both assumed to be linear functions of a. Once the end acceleration is known, the corresponding end state can be computed immediately. The end-acceleration vector a contains 3N unknown components that must be solved. In the example of the Backward Euler integration scheme, the end state is expressed in terms of a by the rules $$v^{n+1}(a)=v^n+\Delta t\, a,$$

$$x^{n+1}(a)=x^n+\Delta t\, v^{n+1}(a) \quad (2)$$

For the Newmark and the BDF-2 schemes, the expressions for $v^{n+1}(a)$ and $x^{n+1}(a)$ are different, but they are still linear in terms of the acceleration a at the end time. An embodiment of the present invention supports any implicit integration scheme that can be put into the form $$v^{n+1}(a)=v^z+\theta a,$$

$$x^{n+1}(a)=x^z+\theta^2 a, \quad (3)$$

where $x^z$ and $v^z$ are the end position and end velocity, respectively, that this integration scheme would produce for an end acceleration of zero, and θ is a constant with units of time. The constant θ, which depends on the choice of integration scheme, is related to the time-step duration Δt. The vectors $x^z$ and $v^z$ may be linear combinations of the start state $(x^n, v^n)$ and possibly earlier states, such as $(x^{n-1}, v^{n-1})$.

In an embodiment of the present invention, large time steps Δt are preferred. Using a larger time step in a simulation may reduce the number of simulated states that need to be computed, and this may in term reduce the overall resources needed to generate an animation of a fixed duration. Higher quality finite-element simulation may be achieved most efficiently at large time steps by employing an implicit integration scheme in the manner described herein. Implicit integrators allow large integration time steps to be taken while retaining quality and stability.

An Implicit Collision Response

The accurate and efficient determination of contact forces that result from collisions may contribute to the stability and the visual quality of a simulation. The contact forces may include both the normal forces and the friction forces at points of contact. As an example, the normal force prevents an object that rests on the ground from falling through the ground. Friction forces may prevent or reduce relative sliding between two objects that are in contact.

To obtain stable and accurate simulated results in a short amount of computation time (the amount of time it takes for the software to provide the user with the desired simulation), it may be important that the simulated forces that are acting against the object(s) in the collision (e.g., the strength of the collisions forces) are such that the objects do not travel straight through each other; the strengths of the contact forces may be determined at the same time as the strengths of the internal forces such as the structural integrity of the material of the which the object can be composed.

Aside from the collision response, an implicit integration scheme typically requires the solution of one or more sparse linear systems of equations at each time step. Here "sparse" means that a significant percentage of entries in the matrix of this linear system tend to be zero. Such a sparse linear system may incorporate the masses of all the simulated elements, all the internal forces (due to internal stresses) and all the applied external forces (e.g., gravity and wind) that affect the simulated objects. By finding or approximating the solution of this linear system (or systems), the state at the end time of the integration step may be obtained. The solution of each sparse linear system may be computed using direct methods for sparse linear systems or approximated using the preconditioned conjugate gradients method (PCG).

When a realistic collision response may be required, the simulation becomes more complicated than just creating and solving a sparse linear system at each integration step. A naive approach for collision response would be to simply move the simulated nodes that are adjacent to the penetrating parts away from each other, regardless of the internal forces that may be affected by the displacements of the colliding parts. However, such an approach may result in simulations that appear incorrect to the human eye and may introduce instability into the simulation, which make the results of the simulation unusable. Such a simplistic collision response would require the integration time step to be so small that it becomes intractable for practical use. More sophisticated collision-response algorithms may take into account the effect that a collision has on the neighboring region within the colliding object. The effect of the collision impact onto the system of forces as a whole may need to be considered to get a realistic collision response at larger time steps. Existing methods and available software may include penalty-based and constraint-based approaches for computing a collision response.

Some existing methods approach the collision response problem by introducing penalty force terms into the linear system. These may be elastic and/or dissipative force terms with fixed coefficients. One possibility may be to model collisions using an artificial damping force (dissipative), as illustrated in FIG. 1B. These artificial damping forces are introduced into the simulation in order to resolve penetrations between objects or to prevent penetrating objects from penetrating further. These artificial damping force terms are incorporated into the sparse linear system that may be solved at each integration step. If the damping coefficients are chosen too small, collisions are not properly resolved, resulting in visible penetrations. If these coefficients are chosen too large, then it may become less efficient to find an approximate solution for the sparse linear system, resulting in an increased use of resources. In this case, the stability of the solutions may be affected as well, which may lead to unusable simulated results.

Another drawback of this type of penalty-based approach may be that the contact forces work in both directions: they work not just in the direction away from the contact but also in the direction to the contact, resulting in "stickiness" artefacts. The only remedy for such stickiness artefacts may be to take smaller integration time steps, which results in the use of more computational resources (which may nullify the large time step advantage of an implicit integration step). Another drawback of such prior art approaches may be that they may not allow physically plausible friction forces, such as Coulomb friction models, to be incorporated.

In summary, the main drawbacks of penalty-based approaches may be: (1) The strengths of the contact forces may not be physically plausible; (2) An artificial "stickiness" (objects may "stick" together in unrealistic fashion) between colliding objects can be introduced; (3) Ad-hoc drag coefficients should be provided by the user to ensure a final separation between the colliding objects.

Other existing methods are based on bilateral constraints instead of penalty forces. Methods based on bilateral constraints may constrain the motion of each individual vertex to stay within a contact plane at that vertex. This approach may be applied to collisions that occur between individual simulated vertices and external objects (which do not include object-to-object and self collisions). In this type of constraint-based approach, each collision would temporarily be turned into a bilateral constraint that is incorporated into the system of equations that define the integration step. This may result in a modified a linear system in which no displacements are possible in the directions of the contact normal vectors, in effect reducing the degrees of freedom of the system. The reduced degrees of freedom may be enforced using a modified version of the PCG method. In effect, the degrees of freedom that violate the contact planes are taken away while the modified linear system is being solved. However, in reality, the resolution of even a single collision may have a significant effect on the system as a whole, and may prevent other parts of the object from touching at all. As a result, bilateral constraints may have as a disadvantage that they may introduce artificial stickiness (e.g., inaccurate or implausible motion of objects, including inaccurate attachment between objects). For example, a simulated rubber ball may appear to stick to a wall like a piece of bubble gum for a short while, after the collision has occurred.

Still other methods pose the collision-response problem as a linear complementary problem (LCP). Such methods may allow contacts to be modeled as unilateral constraints (i.e., constraints that work in only one direction), which may avoid stickiness problems. When friction is used in such a model, the Coulomb friction model may have to be approximated by polyhedral cone. LCP approaches have been successfully used for rigid body simulations. LCP-based methods have been applied to compute collision responses for deformable models as well. However, prior art techniques for computing a collision response that follow an LCP approach may be complicated to implement and may not have any strong guarantees for progress and/or convergence.

The embodiments of the present invention provide for a collision-response method in which internal forces, applied external forces and normal contact forces are solved alongside unilateral constraints The embodiments of the present invention overcome the previously mentioned disadvantages of penetrations and stickiness. In contrast with some previously existing iterative methods, the present invention may provide guarantees that each iteration produces an approximation that is increasingly close to an actual solution. Also, the present invention may be used directly with nonlinear force models. The unilateral constraints of the present invention can be used for all types of collisions: object-to-external, object-to-object, and object-to-self. This includes collision types that involve multiple nodes, such as, for example, four nodes when a tetrahedron vertex collides with a triangular facet of another tetrahedron. The present invention may allow the approximation, within any user-specified accuracy, of a solution of an implicit integration scheme of the form of Equation 3 that includes all normal contact forces such that no penetrations occur and all normal force magnitudes are nonnegative. In addition, the effects of friction forces can be computed based on an accurate approximation of the normal force magnitudes. This may result in realistic rolling and sliding behaviors in a simulation.

An embodiment of the present invention involves finding the solution to a sparse system of equations, which may not be necessarily linear. Instead of adding penalty forces or reducing the degrees of freedom of the system, the present invention can include into the sparse system, contact forces whose strengths may be controlled by variable multipliers (i.e., Lagrange multipliers) whose values are not known a priori, but are determined as a part of the solve. A method of the present invention includes a step that prevents multipliers from becoming negative, thereby preventing any stickiness artefacts at large time steps and retaining the inherent efficiency of the implicit integration step. In addition, an embodiment of the present invention may incorporate a realistic friction model into the system, which relies on an earlier determination of normal force magnitudes.

Aspects of the collision-response embodiments of the invention may include: (1). explicitly maintain multipliers for the contact forces (instead of removing degrees of freedom to prevent contributions that violate collisions); (2). correctly prevent penetrations at contacts; (3). correctly prevent normal contact forces from opposing separation (as opposed to other methods that suffer from sticking artefacts). Advantages of the collision-response algorithm of the present invention over other methods include: (1). Better stability and quality at larger time steps than other methods wherein the higher the resolution of the geometry, the more pronounced this advantage becomes; (2). No stickiness artefacts; (3). More realistic friction, in particular when rolling and sliding motions are involved; and (4) Provisions for each iteration to progress closer to a solution.

The advantages of the present invention are illustrated in FIGS. 1A to 1D, where there may be, by way of illustration, provided a ball that hits an obstacle (e.g., a wall). In this example, the ball starts moving with a velocity of 5 m/s in the positive X-direction (horizontal). The simulation uses an integration time step of 0.05 seconds. In each of the FIGS. 1A, 1B, 1C, and 1D, the initial position $x^1$ is shown as well as seven subsequent positions $x^2$, $x^3$, $x^4$, $x^5$, $x^6$, $x^7$, $x^8$ from left to right. As will become clear based on the description provided herein, FIG. 1A represents a simulation with a collision response. FIG. 1B represents a simulation wherein the collision response uses damping forces. FIG. 1C represents a simulation wherein the collision response uses bilateral constraints. FIG. 1D represents a simulation wherein the collision response uses embodiments of the present invention.

FIG. 1A shows the trajectory of the ball in the absence of any collision response; the simulation simply allows the ball to pass through the wall. This presents to the viewer an idea of the motion of the ball as it would have been if the obstacle (the wall) was not there.

FIG. 1B shows the collision response that would result from incorporating constant-coefficient damping force terms that counteract the relative velocity at the detected contacts. There are at least two visible problems in FIG. 1B: First, the damping force counteracts some of the penetration, but not all of it, leaving a noticeable penetration (see FIG. 1B at time $t^3$. Second, the ball tends to stick against the obstacle, because the damping force works in both directions (not just in the direction opposing the contact normal). This results in an unrealistic motion. FIG. 1C shows the collision response that would result from modeling the collisions as bilateral constraints, removing from the sparse linear system any degrees of freedom in the directions of the contacts. The simulated deformation of the ball as it comes into contact with the wall (between times t=0.10 and t=0.35) may be also unrealistic. The stickiness artefacts are clearly visible at times $t^5$ and $t^6$.

FIG. 1C illustrates how a collision response based on bilateral constraints may result in visible stickiness artefacts. These stickiness effects may introduce energy into the system, which may produce unstable and unusable results at later integration steps. The stickiness problem can be remedied by decreasing the integration time step. However, this increases the total number of integration steps that need to be performed, which may offset the efficiency advantages offered by an implicit integration step.

FIG. 1D may be an example of the preferred embodiments of the present invention which illustrates how these artifacts and defects are resolved. The deformation of the ball may be much more realistic and no artificial stickiness occurs at $t^5$ and $t^6$. At the final frame at $t^8$ the ball may be properly separated and moving away from the obstacle (none of the other response algorithms do this properly). Step 2 in Table 1 ensures that contacts are not sticky, by not allowing the magnitudes of the contact forces to be negative.

Aspects of the present invention are applicable to finite-element simulation, but are not limited thereto. The approach can be used (and may be used) for computing a collision response in other types of simulations that involve deformable solid objects. However, it can be used, without having to make any fundamental changes to other types of simulation, for example in cloth, wire and spring-system simulations. The method can be applied for any type of simulation in which the state can be stored in a finite number of vertices (or nodes) and where the internal and external forces and their partial derivatives can be explicitly computed.

Aspects of the present invention provide a method for computing a collision response that is compatible with an implicit integration scheme of the form given by Equation 3. The steps of this method are summarized in Table 3. The computation of the collision response relies largely on an iterative technique for approximating a solution of the integration scheme in the presence of only normal forces. This iterative technique is called unilateral normal search (UNS) and its steps are summarized in Table 2. Each iteration of UNS uses another sub-method, called polyline search, which is summarized in Table 1. The mathematical concepts that are relied on by these methods are discussed first, after which the tables that summarize the preferred methods are listed.

Each contact force term consists of a normal contribution and a tangential frictional contribution. The normal contact forces are computed such that none of the contacts end up penetrating or sticking. The magnitudes of the normal contributions are taken into account when the frictional components of the contact forces are computed. Each friction force acts in a direction that is orthogonal to the corresponding normal force term The global force that acts on all the nodes of the system is decomposed as $$f = f_u + f_c, \quad (4)$$

where $f_c$ is the sum of all contact forces and $f_u$ is the sum of all remaining internal forces and external applied forces. An embodiment of the present invention is not limited to any particular force model; it can be used with a wide variety of different choices of $f_u$. For each iteration of the UNS method (explained farther below) to progress closer towards a solution, it may be sufficient that both the Jacobian matrices $\partial f_u/\partial x$ and $\partial f_u/\partial v$, wherever defined, are symmetric and nonnegative semidefinite.

Although the method supports nonlinear force models, significant optimizations may be applicable in the case where $f_u$ is linear in both x and v. Even if $f_u$ is nonlinear as a function of position or velocity, it may be advantageous from a performance viewpoint, to use a linear approximation of $f_u$ instead. In this scenario, $f_u$ may be obtained by evaluating a first-order Taylor expansion of the internal and external applied forces. A suitable center for such a Taylor expansion may be based on an initial estimate of the end state $(x^{n+1}, v^{n+1})$ N. Such an estimate of the end state could simply be the start state. Better results may be obtained by choosing the end state that would result if the simulated objects would be constrained to become rigid for the duration of the time step.

A preferred embodiment of the present invention defines the unconstrained residual $r_u$ to be the vector-valued function $$r_u(a) = f_u(x^{n+1}(a), v^{n+1}(a), t^{n+1}) - Ma. \quad (5)$$

The unconstrained residual is a function of the end acceleration a alone. It may be interpreted as the sum of all internal and external forces (excluding any contact forces) and the inertial force term—Ma. The exact solution of the integration step in the absence of any contacts is determined by the vector equation $$r_u(a) = 0. \quad (6)$$

The negation of the Jacobian matrix of $r_u$ at a is denoted by $$H(a) = -\frac{\partial r_u}{\partial a}(a) \quad (7)$$

If the previously mentioned assumptions about the mass matrix M and the Jacobian matrices of $f_u$ are made, it would follow that each 3N×3N matrix H(a) is symmetric and positive definite.

If an embodiment of the present invention is directly used with a nonlinear force model $f_u$, then to show that each iteration progresses towards a solution, it may be sufficient to assume that the unconstrained residual $r_u$ is equal to the negation of the gradient of some scalar-valued function h=h(a). In this case, H(a) would be the Hessian matrix of h(a). To show that each iteration of the UNS method progresses towards a solution, it may be sufficient to choose h such that each corresponding Hessian matrix H(a), wherever defined, is positive definite.

The terms of the combined contact force $f_c$ of Equation 4 depend on a set of contacts. This set of contacts is formed from the results of a preceding collision-detection step. The contacts are used to augment the unconstrained system of Equation 6 with contact force terms and contact constraints. For each contact, there is a constraint inequality that expresses that no penetration must occur; the two sides of a contact must remain separated by the contact plane. In addition, the contact force is required to point in a direction that separates the two sides of a contact. Furthermore, whenever a contact is separated by a positive amount, the corresponding normal force term must have a magnitude of zero. The magnitude and the direction of the frictional component of a contact force term may depend on the normal force magnitude and the relative tangential velocity at the contact, respectively.

Contacts may involve geometric primitives. Some of these primitives may correspond to objects that are simulated, but others may correspond to external objects, which have fixed, animated trajectories. Each vertex of a simulated object is identified with a node. Each node corresponds to a triple of variables in the system of Equation 6. The positions and velocities of vertices of external objects are treated as constants in the system. An external collision object may be represented alternatively using a signed distance function (SDF) instead of using geometric primitives.

For each detected collision, the corresponding contact may depend on multiple nodes. Label the two sides that are involved of the contact by A and B. For example, the following cases may apply:
1. A is a single vertex and B is an SDF
2. A is a single vertex and B is a triangle or a tetrahedron face
3. A is an edge and B is another edge
4. A is a triangle and B is a single vertex These are common types of contacts, but an embodiment of the present invention is not limited to these.

The UNS method processes multiple contacts simultaneously. The set of all contacts under consideration is indexed by numbers in the range 1, ..., m, where m is the number of contacts. Each contact has two designated sides, labeled by A and B. For the kth contact, the relative vector $\bar{x}_k$ from A to B is given by $$\bar{x}_k = \bar{x}_k^c + W_k^T x^{n+1} \quad (8)$$

where $\bar{x}_k^c$ specifies a constant position term that is independent of the vertex positions and $W_k$ is a 3N×3 matrix of weights. The matrix $W_k$ depends on the barycentric coordinates that are associated with the contact. Denote by $\alpha_i$, for i=1, ..., N, the barycentric weights for nodes of side A and by $\beta_j$, for j=1, ..., N, the barycentric weights for nodes of side B. It is assumed that there is no overlap between the barycentric coordinates of A and B; there is no node index k for which both $\alpha_k \neq 0$ and $\beta_k \neq 0$. Each weight matrix $W_k$ is defined such that for all x, $$W_k^T x = \sum_j \beta_j x_j - \sum_i \alpha_i x_i \quad (9)$$

Explicitly, the matrix elements of $W_k$ that correspond to side A are specified by $$(W_k)_{3i-2,1} = (W_k)_{3i-1,2} = (W_k)_{3i,3} = -\alpha_i \quad (10)$$

and the matrix elements for side B are given by $$(W_k)_{3j-2,1} = (W_k)_{3j-1,2} = (W_k)_{3j,3} = \beta_j \quad (11)$$

All remaining elements of $W_k$ are zero. In an implementation of a preferred embodiment of the invention, it would not be necessary to explicitly store all of $W_k$. Only the nonzero barycentric coordinates and their corresponding node indices would have to be stored in computer memory. For example, for a vertex-triangle contact, where A is a vertex and B is a triangle, $\alpha$ would have at most one nonzero entry and $\beta$ would have at most three nonzero entries.

In addition to a weight matrix $W_k$, each contact index k has associated with it two mutually orthogonal, unit-length tangent vectors $t_{k,1}$ and $t_{k,2}$ that span the oriented contact plane. The unit contact normal is defined as the cross product $$n_k = t_{k,1} \times t_{k,2}. \quad (12)$$

The order of the two tangent vectors is chosen such that the contact normal points in the direction that would separate the two sides of the contact. The contact normals are used to evaluate the amount of separation for each contact.

For each contact index k, embodiments of the invention may treat the weight matrix $W_k$ and the two tangent vectors $t_{k,1}$ and $t_{k,2}$ as constants. (As a result, each $n_k$ is constant as well.) Both the barycentric weights and the contact plane may be computed based on the end position that was used in the preceding collision-detection pass. Keeping the barycentric coordinates and the contact plane constant allows the amount of separation and the relative velocity to be expressed as linear functions of position and velocity, respectively.

The separation at the kth contact is given by $$s_k = n_k^T \bar{x}_k - \tau_k, \quad (13)$$

where $\tau_k$ is a constant. Because the contact normal $n_k$ has unit length, this separation value expresses a signed distance between the two sides of the contact. The separation $s_k$ is negative if and only if the contact is penetrating. The UNS method computes solutions for which each contact is separated, that is, $s_k \geq 0$ for each k in 1, ..., m. The relative position vector $\bar{x}_k$ depends on the global position vector $x^{n+1}$, which in turn through Equation 3 depends on the global acceleration vector a. Thus an embodiment of the present invention may treat the separation at the kth contact as a direct function $$s_k = s_k(a) \quad (14)$$

of the global end acceleration vector a.

The relative velocity vector between the two sides of the kth contact is $$\bar{v}_k = \bar{v}_k^c + W_k^T v^{n+1}. \quad (15)$$

The computation of friction depends on the tangential component of the relative velocity at a contact, which is given in terms of the two tangent vectors $t_{k,1}$ and $t_{k,2}$ by $$t_k = \sum_{i=1,2} (t_{k,i}^T \bar{v}_k) t_{k,i} \quad (16)$$

Through Equations 15 and 3, the relative tangential velocity at each contact may be expressed directly as a function $$t_k = t_k(a) \quad (17)$$

of the global end acceleration vector.

A preferred embodiment of the present invention assumes that the set of contacts is linearly independent. This means that the vectors $W_k n_k$ with k=1, ..., m should be linearly independent in 3N-dimensional space. If the set of contacts that is generated by the collision-detection pass is not linearly independent, then a solution a that satisfies $s_k \geq 0$ for all k may not generally exist. In such cases, a reasonable solution may be approximated by grouping contacts into smaller batches, each of which consists of linearly independent contacts. It is possible to run the UNS method separately for each such batch of contacts. The contact force that results from one run of the algorithm can be absorbed as an applied force term into $f_u$ for the next run of the algorithm. The same batching technique may be applied whenever a new collision-detection pass, that is performed after the first collision response, results in new, previously undetected contacts. This way, the UNS method can be run additionally for secondary collision-detection passes. In use cases where there are many simultaneous collisions, using multiple smaller batches of contacts may be a way to get faster solve speeds in exchange for a lower accuracy.

The contact-force term for the kth contact is the sum of a normal contribution and a friction contribution. The normal component of each contact-force term has the form $$\lambda_k n_k, \quad (18)$$

where $\lambda_k$ is a Lagrange multiplier that determines the magnitude of the normal force. The friction contribution has the form $$\phi_{k,1} t_{k,1} + \phi_{k,2} t_{k,2} \quad (19)$$

where the multiplier pair ($\phi_{k,1}$, $\phi_{k,2}$) controls the direction and magnitude of the friction force. The normal direction $n_k$ and the two tangent basis vectors $t_{k,1}$ and $t_{k,2}$ may be combined into a single 3×3 matrix $$C_k = (n_k, t_{k,1}, t_{k,2}), \quad (20)$$

which is specified by its three columns. Given the three contact-force multipliers $\lambda_k$, $\phi_{k,1}$ and $\phi_{k,2}$, the corresponding relative contact force equals the matrix-vector product $$C_k \begin{pmatrix} \lambda_k \\ \phi_{k,1} \\ \phi_{k,2} \end{pmatrix} = \lambda_k n_k + \phi_{k,1} t_{k,1} + \phi_{k,2} t_{k,2} \quad (21)$$

The normal multipliers for all contacts can be specified by a single m-dimensional vector $\lambda$. The tangent multipliers can be specified using a 2m-dimensional vector $\phi$, in which the multipliers $\phi_{k,1}$ and $\phi_{k,2}$ are stored at the coordinate indices 2k−1 and 2k, respectively. The combined contact force for the system is given by $$f_c(\lambda, \phi) = \sum_{k=1}^{m} W_k C_k \begin{pmatrix} \lambda_k \\ \phi_{k,1} \\ \phi_{k,2} \end{pmatrix} \quad (22)$$

Because the method of the present invention treats $n_k$, $t_{k,1}$ and $t_{k,2}$ as constants, each matrix $C_k$ in the above equation is also constant. This makes the contact force $f_c$ a linear function in the pair ($\lambda$, $\phi$).

Adding the combined contact force to the unconstrained residual leads to the definition of the residual $$r(a, \lambda, \phi) = r_u(a) + f_c(\lambda, \phi). \quad (23)$$

Any exact solution to the integration step that includes the collision response would have to satisfy the vector equation $$r(a, \lambda, \phi) = 0, \quad (24)$$

where the bold 0 specifies a vector that consists of 3N zeroes. This equation has a candidate solution a for each possible choice of $\lambda$ and $\phi$.

The implicit collision response of a preferred embodiment of the present invention may be computed in two stages:
1. The first stage applied the UNS method to determine a frictionless solution along with a set of contacts E and a tuple $\lambda$ of normal-force multipliers.
2. The second stage determines a global solution that includes friction force terms, which are controlled by the normal multiplier tuple $\phi$, while both E and $\lambda$ are being kept fixed as constants.

The first stage finds a solution a for Equation 24 with the tuple of friction multipliers $\phi$ kept at 0, while aiming to satisfy the three conditions 1. $s_k \geq 0$, \quad (25)

2. $\lambda_k \geq 0$, \quad (26)

3. if $s_k \geq 0$, then $\lambda_k = 0$ \quad (27)

The first condition ensures that the separation for each contact is nonnegative; the contacts are not allowed to penetrate. The second condition ensures that no sticking occurs; the contact forces must be such that they push the two involved sides away from each other. The third condition ensures that all contacts that are separated by a positive signed distance have a zero normal force term. In other words, each contact that has a nonzero normal force term must be touching.

Given that the contacts are linearly independent, a set of 3N-dimensional dual direction vectors $u_l$ for l=1, . . . , m, may be determined such that for all 1≤k,l≤m, the scalar $$n_k^T W_k^T u_l \quad (28)$$

equals 1 if k=l and equals 0 otherwise. Such a set of dual directions can be formed as follows. For each l=1, . . . , m, the dual vector $u_l$ may be expressed as a linear combination $$u_l = \sum_k \gamma_{lk} S^{-1} W_k n_k \quad (29)$$

The dual directions need not be stored as full 3N-dimensional vectors in memory. Depending on the set of contacts, they may be represented more sparsely as lists of contact indices with weights. The m×m matrix $\Gamma$ whose element at row l and column k equals $\gamma_{lk}$ is determined by $$\Gamma^{-1} = F^T S^{-1} F \quad (30)$$

where the F is the matrix whose kth column is $W_k n_k$. There are common use cases where the weights $\gamma_{lk}$ that determine the dual directions are zero for all l≠k. In those cases, each dual vector is simply given by $$u_l = S^{-1} W_l n_l. \quad (31)$$

An example of such a case occurs when a 3×3 block-diagonal preconditioner S is used with a contact set in which each individual vertex has at most one collision, with an external object. Alternatively, the process of constructing the dual directions as nontrivial weighted sums may be avoided completely by running the UNS method in separate smaller batches of contacts for which the dual directions can be expressed as in Equation 31.

Throughout the first stage, the normal multipliers are expressed as functions of a whereas the tangent multipliers are kept zero everywhere. Throughout the iterations, the algorithm maintains a set of contact indices E, which is called the enabled set. Given the set of enabled contacts E, the functional dependence normal multipliers on the current approximation of the end acceleration a is defined as follows. For contact index k the corresponding multiplier is specified by the function $$\lambda_k^E(a) = \begin{cases} -r_u(a)^T u_k & \text{if } k \in E, \\ 0 & \text{otherwise.} \end{cases} \quad (32)$$

Throughout the iterations, the algorithm modifies the enabled set of contacts E. Which case of Equation 32 applies is always determined using the current enabled set E. So the multipliers depend not only on a, but on the contents of the enabled set E as well.

The enabled set E is initialized with all contact indices k for which $s_k(a) \leq 0$. The initial approximation of the acceleration is formed from the initial guess using the update rule $$a' = a + \sum_{k \in E} \delta_k u_k \qquad (33)$$

where for each k in E, $$\delta_k = -\theta^{-2} s_k(a). \qquad (34)$$

This rule adapts the end acceleration a with the aim of obtaining a corresponding global end position $x^{n+1}(a)$ that has no penetrations.

The first stage consists of multiple iterations, each of which aims to improve the current approximation a, while changing the contents of the enabled set E and the corresponding normal-force multipliers. Before an iteration is performed, there are available a current enabled set E and a current approximate acceleration a. In addition, there is available a copy p of the final search direction of the previous iteration. Each iteration performs a so-called polyline search. This polyline search starts out with a search direction d that is computed based on value of the residual at a and the last search direction p from the previous iteration. For the initial iteration, the previous search direction is chosen p=0.

Each polyline search itself consists of multiple segment searches. For each segment search, a base search direction b is chosen as $$b = S^{-1} r(a, \lambda, 0). \qquad (35)$$

Due to the way the normal multipliers are defined by Equation 32, this search direction has no contribution in the direction of the normal constraints. That is, for all k in E, $$n_k^T W_k^T b = 0. \qquad (36)$$

From the search direction p of a previous polyline search, a projected direction q may be obtained such that for all enabled contacts k in E, $$n_k^T W_k^T q = 0. \qquad (37)$$

The projected direction q is obtained from p by $$q = \Pi^E p \qquad (38)$$

where the 3N×3N matrix $\Pi^E$ is defined by the vector equation $$\prod\nolimits^E p = p - \sum_{k \in E} (n_k^T W_k^T p) u_k \qquad (39)$$

The vector q is the projection of p onto the linear subspace that is defined by E. That is, along the ray from a in the direction of q, all separations for enabled contacts remain constant.

Using the base search direction b and the projection q of the previous search direction p, the current search direction d is formed as a linear combination $$d = b + \beta q \qquad (40)$$

where $$\beta = \begin{cases} -\dfrac{(r^T b)(q^T Hb) - (r^T q)(b^T Hb)}{(r^T b)(q^T Hq) - (r^T q)(q^T Hb)}, & \text{if } (r^T b)(q^T Hq) \neq (r^T q)(q^T Hb), \\ 0 & \text{otherwise.} \end{cases} \qquad (41)$$

The assumption that H(a) is positive definite may ensure that the denominator in this fraction is not zero. If the previous search direction p happens to be zero, which occurs at the first iteration, then the current search direction is simply chosen as $$d = b \qquad (42)$$

Each segment search within a single polyline search may have a different search direction d. This change happens because at the end of a segment search, new contacts may be inserted into the enabled set E. The value d that is used in the last segment search of a polyline search is used as the p in the next polyline search. The polyline search procedure is explained in more detail below.

All the segment searches that occur within a single polyline search compute their search direction d making use of the same p that was retained from the previous polyline search. Each segment search updates the end acceleration by $$a' = a + \alpha d. \qquad (43)$$

This new acceleration is subsequently used as the starting point a of the next segment search, which may use an updated enabled set E and a new search direction d as well. If no more progress can be made in a segment search, then the polyline search terminates.

The current search parameter α for the segment search is picked from the half-open range (0, α*], where the upper limit α* is chosen as the smallest positive number for which $$r(a+\alpha^* d, \lambda^E(a+\alpha^* d), 0)^T d = 0. \qquad (44)$$

In the case where $r_u$ is linear in a, the Jacobian matrix is constant H(a)=H, so that α* is given explicitly by $$\alpha^* = \frac{r^T d}{d^T H d}, \qquad (45)$$

with r=r(a, λ(a), 0). For nonlinear $r_u$, multiple Newton iterations may be performed to approximate α*. Each of these Newton iterations may consist of computing a search parameter using Equation 45 and subsequently updating the current acceleration using Equation 43.

After an optimal search parameter α* for the segment search has been determined, all hit events are determined. A hit event may potentially occur for any contact k that is not in the enabled set E and for which $s_k(a) > 0$. For the kth contact, a hit event occurs at a parameter α if $0 < \alpha \leq \alpha^*$ and $$s_k(a + \alpha d) = 0 \qquad (46)$$

The parameter that corresponds to a hit event is called the hit parameter. For a hit event to occur, it is necessary that $n_k^T W_k^T d < 0$. In that case, the corresponding hit parameter may be given by $$\alpha = -\frac{\theta^{-2} s_k(a)}{n_k^T W_k^T d}. \qquad (47)$$

When the enabled set E, the current approximation a, the current search direction d and upper bound α* are understood, the corresponding set of hit parameters may be denoted by P. After all the hit events have been determined, the current search parameter α is chosen to be the minimum of α* and all positive parameters corresponding to hit events. This parameter α is then used with Equation 43 is used to update the current acceleration a. After this, the set E is updated as well: For each k not in E, k is inserted into E if $s_k(a) \leq 0$. If no hit events occurred during a segment search (P is empty), then the polyline search terminates. Otherwise, the updated a and E are used for the next segment search. Repeated segment searches are performed until a line segment occurs no more events or when the residual becomes sufficiently small. The steps of the Polyline-Search method are summarized in Table 1.

In the case where $r_u$ is linear in a, significant performance optimizations can be made to the Polyline-Search method. For each segment search that the polyline search performs, it would appear necessary to re-compute the entire residual $r=r(a, \lambda^E(a), 0)$. However, in the case where $r_u$ is linear in a, the line search parameters are determined by Equation 45. This equation does not directly require the residual r; it depends only on the values $r^T d$ and $d^T H d$. These values may be maintained more efficiently, without fully re-computing r.

Multiple polyline searches are performed until no more progress can be made. That completes the UNS method. The second stage uses the set E of enabled contacts that resulted from UNS, without changing it, to compute the change in acceleration due to friction force terms. Here, the friction forces are controlled by a tangent multiplier tuple $\phi^E$ which is described further below. The acceleration a that resulted from the first stage is kept fixed during the second stage. The set of enabled contacts defines a subspace of alternative acceleration vectors, each of which may be written as $a+\Pi^E \delta$. Each of these alternative acceleration vectors has a separation of zero for all contacts in E. The second stage computes such an alternative acceleration $a'=a+\Pi^E \delta$ that is an approximate solution of $$(\Pi^E)^T r(a', \lambda^E(a), \phi^E(a')) = 0 \quad (48)$$

Here, the nonnegative normal multipliers $\lambda^E(a)$ that resulted a from the first stage are treated as constants. Depending on the internal force model and the friction model used, this equation may be nonlinear. A solution may be approximated by using multiple linear solves in which the internal force model and/or the friction model are linearized. For example, preconditioned conjugate gradient method may be used for each such linear pass, where the projection operator $\Pi^E$ is incorporated into both the matrix (or linear operator) and the constant vector of the linear system. In this stage the friction forces are controlled by the multiplier tuple $\phi^E(a)$, which depends on the tangential components of the relative velocities at the enabled contacts. The second stage starts at Line 8 of FIG. 2.

The tangent multiplier tuple $\phi^E$ that determines the enabled friction force terms may be defined as a function of the end acceleration a as follows. The directions of the friction forces are based on the tangential components of the relative velocities at the contacts. For any contact index k, the tangential component t of the relative velocity $\bar{v}$ at the contact is given by Equation 16.
The positive normal multipliers $\lambda = \lambda^E(a)$ that resulted from the first stage are kept constant. The multiplier values are positive for contacts in E and zero otherwise. For each contact index, define a corresponding dissipation function $$D_k(\bar{v}) = \lambda_k \kappa(t_k(\bar{v})), \quad (49)$$

where κ is a function that maps the tangent component of the velocity to a nonnegative scalar. The kth contact force is now defined in terms of the 3-dimensional gradient of $D_k$. The relative friction force at the kth contact is determined by the multipliers $\phi_{k,1}{}^E$ and $\phi_{k,2}{}^E$. Thus, the friction-force multipliers are chosen for i=1,2 as $$\phi^E_{k,i}(a) = -\lambda_k \frac{\partial \kappa}{\partial \bar{v}} (t_k(\bar{v}_k(a))) t_{k,i}. \quad (50)$$

This way, the tuple of friction multipliers $\phi^E$ is expressed as a function of a, given a constant tuple λ of normal multipliers. The preferred embodiments of the present invention are not limited to the above family of friction models; other friction models may be used instead by defining $\phi^E$ differently as a function of all the values $t_{k,1}{}^T \bar{v}_k(a)$ and $t_{k,2}{}^T \bar{v}_k(a)$ with k in E.

When a dynamic Coulomb friction model needs to be approximated, $\kappa(\bar{v})$ could be defined as a function that closely approximates $\|\bar{v}\|$. However, special care would need to be taken when dealing with the singularity in the gradient around $\bar{v}$. A smooth function K that approximates the length of the tangent vector, but which avoids the singularity in the gradient around the origin may be used.

The steps of the collision response are summarized in Table 3. As an input, this algorithm takes an initial approximation a for the end acceleration. But in principle, any choice of initial a would work. However, in many cases, fewer iterations of the UNS method may be required if a good initial approximation is chosen, for example, the solution to the unconstrained system r(a, 0, 0)=0.

TABLE 1

Perform a polyline search to get closer to a solution

Polyline-Search 1. q := $\Pi^E$ p
2. if segment = 1, then
   for each k in E: if $\lambda_k^E(a) \leq 0$, then remove k from E
3. r := r(a, $\lambda^E(a)$, 0)
4. b := $S^{-1}$ r
5. if $r^T b \leq \in$, then RETURN
6. $$\beta = \begin{cases} -\frac{(r^T b)(q^T Hb) - (r^T q)(b^T Hb)}{(r^T b)(q^T Hq) - (r^T q)(q^T Hb)}, & \text{if } (r^T b)(q^T Hq) \neq (r^T q)(q^T Hb), \\ 0 & \text{otherwise.} \end{cases}$$
7. d := b + βq
8. if $r^T d < 0$ then d := -d
9. find the smallest α* > 0 such that $r(a + \alpha^* d, \lambda^E(a + \alpha^* d), 0)^T d = 0$
10. determine the set P of all hit parameters for E, a, d and α*
11. if P is empty, then set α := α*, else set α := min(P)
12. a := a + αd
13. for each k not in E: if $s_k(a) \leq 0$, then insert k into E
14. segment := segment + 1
15. if P is empty, then RETURN
16. GOTO 1

TABLE 2

Compute a collision response including only normal contact force terms
Unilateral-Normal-Search 1. initialize E as the set of all k for which $s_k(a) \leq 0$
2. for each k in E: a := a − $\theta^{-2}$ $s_k(a)$ $u_k$
3. p := 0
4. segment := 1

TABLE 2-continued

Compute a collision response including only normal contact force terms
Unilateral-Normal-Search 5. perform the steps of Polyline-Search
6. p := d
7. if segment > 1, then GOTO 4

TABLE 3

Compute a collision response including normal forces and friction
Compute-Collision-Response 1. perform the steps of Unilateral-Normal-Search
2. $\lambda := \lambda^E$ (a)
3. find an approximate solution a' of the form a' = a + $\Pi^E\delta$ for
   $(\Pi^E)^T r(a', \lambda, \phi^E(a')) = 0$
4. a := a'
5. for each k not in E: if $s_k(a) \leq 0$, then insert k into E
6. for each k in E: a := a − $\theta^{-2} s_k(a) u_k$
7. Compute the global end position $x^{n+1} = x^{n+1}(a)$
8. Compute the global end velocity $v^{n+1} = v^{n+1}(a)$ A Four Dimensional Data Structure for Accelerating Continuous Collision Detection Before a collision response, as shown in FIG. 1, can be computed, it must be determined what the potential contacts are. This involves finding out which pairs of geometric primitives may be colliding. The problem of finding these pairs of potentially colliding geometric primitives is called collision detection. A straightforward, brute-force approach to collision detection could be the following: Test each geometric primitive in a scene against each other geometric primitive. This may be very slow; for example, in a scene with 500,000 polygons, it may be required to perform approximately 124,999,750,000 collision tests (when ruling out collisions of a geometric primitive with itself). For this reason, most implementations of collision-detection systems may need to employ spatial data structures to accelerate up collision queries. These data structures allow large sets of pairs that don't collide to be ruled out from consideration very quickly.

Fast collision detection may be important for efficient physics simulation. Collision-detection tests can be computationally intensive (e.g., long computation times, high resource cost). Collision-detection algorithms and data structures are, therefore, preferably efficient. A collision-detection pass in a solver may typically comprise two phases: (1) coarse, which may involve finding potentially colliding pairs of features using a spatial data structure and (2) fine, which may involve determining actual collisions between potentially colliding features.

Many existing spatial data structures that may be used in the coarse phase, such as the KD-tree and the octree, hierarchically divide up three-dimensional space into simple shapes, typically bounding boxes. Other approaches create a tree structures that represent bounding volume hierarchies (BVH). Such approaches may be efficient when only static collision detection tests need to be performed, where intersections between geometric primitives need to be determined at a fixed point in time.

Continuous collision detection consists of determining whether two geometric primitives with prescribed trajectories may intersect at any time in between two given times. It will be understood that known optimization techniques for collision detection may have a performance disadvantage when used with continuous collision detection: a fast-moving object tends to have a large, stretched-out bounding region. As a result, for fast moving objects, many overlapping region pairs will end up being reported as potential collisions, which may cause the expensive test for continuous collision detection to be invoked many more times than needed.

In a preferred embodiment, a finite element solver, such as, but not limited to, that found in HOUDINI™, may use a data structure which overcomes this problem. The structure can be similar to a KD tree, but instead it has a four-dimensional nature. The planes that separate the sub-trees can be moving between the start and the end of each sub-step. This can help to avoid nearby features with non-overlapping bounding boxes that move at similar velocities from needing to be considered as a potential collision. This exploitation of coherency of position and velocity over space results in a considerable reduction of expensive fine-phase collision tests.

A preferred embodiment of the present invention may be a tree data structure in which each sub-tree corresponds to a region in a four-dimensional space (which may be comprised of both 3D space and time). In particular, each sub-region may be the intersection of six moving, axis-aligned linear halfspaces that may be chosen to fit as tightly around moving geometric primitives as possible. This 4D data structure may be more efficient in exploiting the local coherency in velocities (nearby vertices in a mesh tend to have similar velocities) than prior-art 3D data structures. This may result in faster self-collision checks, for example.

An aspect of the present invention describes an original data structure that may be used to accelerate collision detection between geometric primitives, which may include, but not be limited to particles, line segments, triangles and tetrahedra. This data structure is a binary tree in which each tree node represents a subset of a 4-dimensional space $[-1, 0] \times \mathbb{R}^3$, where the first coordinate is a parameter that is relative to a time interval and the last three coordinates indicate a spatial position. For the time parameter, the convention is used that −1 represents the start of the integration step and 0 represents the end of the step.

An aspect of the present invention incorporates accelerate continuous collision detection for a set of moving geometric primitives. For simplicity, the discussion is limited to simplices, although an embodiment of the present invention itself may be applied to more general types of geometric primitives (e.g., polygons and convex polyhedra). In 3-dimensional space, a simplex may be a particle (single point), a line segment, a triangle or a tetrahedron. Each such simplex has a finite number of vertices: one for an isolated particle, two for a line segment, three for a triangle, and four for a tetrahedron. A simplex may have vertices $v_1, \ldots, v_r$, where r is the number of vertices of the feature. The trajectory of each vertex of time is determined by the global start position $x^n$ and the global end position $x^{n+1}$. Vertex goes v from position $x_v^n$ at time $t^n$ to position $x_v^{n+1}$ at time $t^{n+1}$. The trajectories of the simplex vertices are interpolated linearly between $t^n$ and $t^{n+1}$.

Continuous collision detection is the problem of determining whether at any time between a start time and an end time, two simplices may intersect. For a pair of simplices A and B, with r and s vertices, respectively, there is a collision between A and B if $$\sum_{v=1}^{r} \alpha_v (x_v^{n+1} + \gamma(x_v^{n+1} - x_v^n)) = \sum_{w=1}^{s} \beta_w (x_w^{n+1} + \gamma(x_w^{n+1} - x_w^n)) \quad (51)$$

for some $\alpha_1 \geq 0, \ldots, \alpha_r \geq 0$ with $\Sigma_{v=1}^r \alpha_v = 1$, some $\beta_1 \geq 0, \ldots, \beta_s \geq 0$ with $\Sigma_{w=1}^s \beta_w = 1$ and some relative time parameter $\gamma \in [-1, 0]$. This equation states that a collision occurs whenever there is a time between times $t^n$ and $t^{n+1}$ such that A and B have a position in common, when linear interpolation is used.

For each moving simplex, an embodiment of the present invention defines a bounder. Within the context of this invention, a bounder is meant to be a subset of $[-1, 0] \times \mathbb{R}^3$ which can be seen as an axis-aligned bounding box whose side planes move independently of each other over time. Each tree node has a bounder associated with it, although a full representation of it may not be explicitly stored in that tree node.

The present invention may define a bounder for any simplex whose vertices are following linear trajectories over a time interval. At a fixed time, a three-dimensional point-wise lower bound $l$ may be defined such that for each coordinate index $c=1, 2, 3$, the scalar $l_c$ is the lower bound of the simplex along that coordinate. Here $c=1$ is the X-axis, $c=2$ is the Y-axis, and $c=3$ is the Z-axis. Such point-wise lower bounds may be formed for both the start time and the end time of a time interval, resulting in vectors $l^n$ and $l^{n+1}$, respectively. For each relative time parameter $\gamma$ in the interval $[-1, 0]$, the point-wise lower bound may be expressed as $$l(\gamma) = l^{n+1} + \gamma(l^{n+1} - l^n) \qquad (52)$$

Analogously, an embodiment of the present invention defines point-wise upper bounds $$u(\gamma) = u^{n+1} + \gamma(u^{n+1} - u^n) \qquad (53)$$

The bounder that corresponds to $l^n$, $l^{n+1}$, $u^n$ and $u^{n+1}$ consists of all four-dimensional points $(\gamma, x)$ that satisfy the inequalities $$l_c(\gamma) \leq x_c \leq u_c(\gamma) \qquad (54)$$

for each spatial coordinate axis $c=1, 2, 3$.

Specifically, for a simplex F with r vertices, a bounder may be computed as follows. Point-wise lower bounds for the contribution in the cth coordinate axis at the start time and the end time can be explicitly computed as $$(l^n)_c = \min_{i=1,\ldots,r} (x_{v_i}^n)_c \qquad (55)$$

$$(l^{n+1})_c = \min_{i=1,\ldots,r} (x_{v_i}^{n+1})_c \qquad (56)$$

Analogously, point-wise upper bounds may be explicitly computed as $$(u^n)_c = \max_{i=1,\ldots,r} (x_{v_i}^n)_c \qquad (57)$$

$$(u^{n+1})_c = \max_{i=1,\ldots,r} (x_{v_i}^{n+1})_c \qquad (58)$$

The resulting vectors $l^n$, $l^{n+1}$, $u^n$ and $u^{n+1}$ define a bounder for the simplex f through Equation 54. For each bounder G, the corresponding pointwise minima for the start time and the end time are denoted by $l^n(G)$ and $l^{n+1}(G)$, respectively. The corresponding pointwise maxima for the start time and the end time are denoted by as $u^n(G)$ and $u^{n+1}(G)$, respectively. If there is a collision between two simplices A and B, then the two corresponding bounders must intersect. This principle is used to efficiently determine all pairs of simplices that may potentially be colliding.

For each simplex f, the corresponding bounder is denoted $G_f$. The collision of all simplex bounders $G_f$ is used to construct a tree data structure, and this collection is referenced again when the tree data structure is queried for potential collisions.

For any two given bounders $G_{f_1}$ and $G_{f_2}$, there exists a minimal bounder G that contains both $G_{f_1}$ and $G_{f_2}$. The vector $l^n(G)$ is the point-wise minimum of the corresponding vectors for $l^n(G_{f_1})$ and $l^n(G_{f_2})$. The vector $l^{n+1}(G)$ is defined the same way, using $l^{n+1}(G_{f_1})$ and $l^{n+1}(G_{f_2})$. Analogously, $u^n(G)$ and $u^{n+1}(G)$ are defined as point-wise maxima.

The tree data structure of the present invention consists of internal nodes and leaves. Each internal node x has a pointer to a left child node left[x] and a right child node right[x]. Each leaf node stores only an index external-index[x] of a simplex.

Each internal node x in the present invention's augmented binary tree data structure has an associated spatial coordinate axis index c, which is defined as the depth in the tree modulo 3 plus 1. For example, the root node r, which has depth 0 has coordinate axis 1 (the X-axis). Any child of c of r has depth 1 has coordinate axis 2 (the Y-axis). Any child d of c would have coordinate axis 3 (the Z-axis). Any child e of d would again have coordinate axis 1, and so on. To save computer memory resources, aspects of the invention may not actually store the coordinate axis index for each tree node; to know the axis index that corresponds to a node, it may keep track of the depth of a node in the tree that is created or queried.

In addition to pointers to child nodes, each internal node x stores the scalars us[x], ue[x], ls[x] and le[x]. The values us[x] and ue[x] are upper bounds for any simplex vertices in the left subtree in the direction of the axis of x. Analogously, ls[x] and le[x] are lower bounds for any simplex vertices in the right subtree in the direction of the axis of x.

Table 4 summarizes the steps that are involved in creating the 4D tree data structure. It is assumed that all the input simplices are stored in an array $f_1, \ldots, f_F$ and that the corresponding bounders are pre-computed and stored in a parallel array $G_{f_1}, \ldots, G_{f_F}$. The method Tree-Create takes as an input a set I of indices into the array $f_1, \ldots, f_F$. The root of the entire tree is created by calling Tree-Create(I, d), where I={1, \ldots, F} and d=0 is the depth of the root node. It is assumed that $F \geq 1$.

In step 7 of Tree-Create, the set of indices I can be partitioned in two subsets $I_{left}$ and $I_{right}$. One way of obtaining this partition is the following: For each i in I, define the midpoint $m_i$ of $G_1$ in the direction c at the start of the time interval by $$m_i := ((l_s(G_{f_i}))_c + (u_s(G_{f_i}))_c)/2. \qquad (59)$$

Let M be the median of all the $m_i$ with i in 1. A partition of I is formed by defining $I_{left}$ to be the set of all indices i in I with $m_i < m$ and letting $I_{right}$ consist the remaining elements of I.

After the tree is constructed, it can be used to answer intersection queries between bounders efficiently. For any query simplex f, a list of indices of potentially colliding simplices may be obtained. For this, the function Tree-Query of Table 5 may be called, where x is the root node of the entire tree, the time interval $[\gamma_l, \gamma_u]$ equals $[-1, 0]$, the query bounder Q equals $G_f$, and the depth d is 0. The function Tree-Query reports all indices of simplices whose corresponding bounders intersect $G_f$.

The algorithm Tree-Query makes use of the helper method Limit-Upper-Lower of Table 6. This helper method helps narrow down the time interval within which a query bounder may intersect any bounders associated with a subtree. Step 4 of Tree-Query in Table 5, the present invention tests whether two bounders intersect. This intersection test can be performed by calling Limit-Upper-Lower for all axes and both orderings of the bounders.

TABLE 4

Create a (sub-)tree for a set of simplex indices
Tree-Create(I, d)

1. if I has more than one element, then GOTO 5
2. let i be the only element of I
3. create a new leaf node x with external-index[x] := i
4. RETURN (x, $G_{f_i}$)
5. create a new internal node x
6. c := 1 + d mod 3
7. create a partition $I_{left}$ and $I_{right}$ of I using axis c
8. (left[x], $G_{left}$) := Tree-Create ($I_{left}$, d + 1)
9. (right[x], $G_{right}$) := Tree-Create ($I_{right}$, d + 1)
10. us[x] := $(u_s(G_{left}))_c$
11. ue[x] := $(u_e(G_{left}))_c$
12. ls[x] := $(l_s(G_{right}))_c$
13. le[x] := $(l_e(G_{right}))_c$
14. compute the smallest bounder G that contains both $G_{left}$ and $G_{right}$
15. RETURN (x, G)

TABLE 5

Query a tree with a bounder
Tree-Query(x, Q, $\gamma_l$, $\gamma_u$, d)

1. If x is an internal node, then GOTO 6
2. i := external-index[x]
3. if $G_{f_i}$ does not intersect Q, then RETURN
4. insert index i to the list of results
5. RETURN
6. c := 1 + d mod 3.
7. ($\gamma_l^{left}$, $\gamma_u^{left}$) := Limit-Upper-Lower($\gamma_l$, $\gamma_r$, us[x], ue[x], $(l_s(Q))_c$, $(l_e(Q))_c$)
8. if $\gamma_l^{left} > \gamma_u^{left}$, then GOTO 10
9. $I_{left}$ := Tree-Query(left[x], Q, $\gamma_l^{left}$, $\gamma_u^{left}$, d + 1).
10. ($\gamma_l^{right}$, $\gamma_u^{right}$) := Limit-Upper-Lower($\gamma_l$, $\gamma_r$, $(u_s(Q))_c$,$(u_e(Q))_c$, ls[x], le[x])
11. if $\gamma_l^{right} > \gamma_u^{right}$, then RETURN
12. $I_{right}$ := Tree-Query(right[x], Q, $\gamma_l^{right}$, $\gamma_u^{right}$, d + 1)

TABLE 6

Limit a relative time interval
Limit-Upper-Lower($\gamma_l$, $\gamma_r$, $u_s^A$, $u_e^A$, $l_s^B$, $l_e^B$)

1. δ := $l_e^B$ − $u_e^A$
2. ρ := δ − ($l_s^B$ − $u_s^A$)
3. If δ > 0 GOTO 6
4. If ρ ≥ 0, then RETURN ($\gamma_l$, $\gamma_r$)
5. RETURN (max ($\gamma_l$, δ/ρ), $\gamma_r$)
6. If ρ ≤ 0, then RETURN (0, −1)
7. RETURN ($\gamma_l$, min($\gamma_u$, −δ/ρ))

Implicit Rigid Prediction

Each implicit integration step may involve the construction of a system of equations that incorporates the element masses, the internal forces and the external forces (except contact forces). In general, the forces that occur in the equations of motion may be nonlinear. An implicit integration step may instead use linear approximations (i.e., linearizations) of these forces as functions of position, velocity and time.

Consider the sum $f_u$ of all unconstrained internal and external forces, excluding contact forces. In general, this unconstrained force is a nonlinear function $f_u(x, v, t)$ of position x, velocity v and time t. In order to linearize this force, $f_u$ may be computed along with the corresponding Jacobian matrices $\partial f_u/\partial x$, $\partial f_u/\partial v$, and $\partial f_u/\partial t$ in terms of position, velocity and time, respectively. Each Jacobian matrix consists of partial derivatives; each row corresponds to a component of $f_u$ and each column corresponds to a partial derivative in a particular position, velocity or time coordinate.

Simulations in computer graphics that are based on implicit integration schemes typically use the start state ($x^n$, $v^n$) of the integration step as the center for the force linearization. It matters which state may be chosen as the center of the linearization; the farther away a state may be from the center, the more inaccurate the linearization may be, compared to the exact forces at that state. To obtain stable and accurate results, the center of linearization should be close to the (yet unknown) end state ($x^{n+1}$, $v^{n+1}$) of an implicit integration step.

However, for large time steps, the start state may produce a linearization that is a poor prediction of the forces of the end state. The effects of this may be especially visible for objects that are rotating or deforming rapidly over time. Unstable or poor-quality simulations may result. A common remedy is the use of smaller integration time steps. Alternatively, when a fully implicit integration step is used, it may be possible to follow up the initial linear solve by additional linear solves (Newton-Raphson iterations for systems of equations). Both these remedies add significantly to the total simulation time.

To improve this situation, embodiments of the present invention may perform a step which may be called implicit rigid prediction. This step computes a state that may improve the quality and performance of a simulation when it is used as the center of linearization of the forces. For stiff objects that are rotating rapidly, the implicit rigid prediction may produce a much closer approximation of the ideal end state of each simulated object than the start state would, and as a result, the stability and quality of the integration step may improve even at large time steps. This implicit rigid prediction step may provide an implicit integration scheme with a more accurate initial approximation than prior art methods, resulting in reduced computation times and more stable simulations than may be produced with prior art methods.

Instead of using the start state ($x^n$, $v^n$) of an integration step, aspects of the invention apply a rigid-prediction step to produce a center ($x^{re}$, $v^{re}$) for linearization that tends to be closer to an actual solution of the end state ($x^{n+1}$, $v^{n+1}$) as would be obtained without linearization. This rigid prediction step of the present invention is different from existing rigid body solvers; it may compute a rigid transformation of the start position in a manner that is consistent with and implicit integration step. This means, for example, that for an object that starts out with a zero velocity and that starts falling under gravity, the implicit rigid prediction is exactly equal to the final solution. This would not be the case if an existing rigid body solver that uses an explicit time integration scheme was used to create a prediction.

Aspects of the invention exploit the assumption that for any single connected solid body that is not colliding with any other object both the total linear momentum and the total angular momentum of that object may be unaffected by the internal forces within that object. A preferred embodiment of the present invention splits the total unconstrained force up into internal and external force terms:

$$f_u = f_{int} + f_{ext} \quad (60)$$

The external force model is assumed to be such that the force that acts on a node is independent of the states of other nodes: For a node with index i, the force $(f_{ext})_i$ on that node at the end time of the integration step depends only on the position $x_i^{n+1}$ and velocity $v_i^{n+1}$ of that node. For the purpose of determining a rigid prediction, it may be assumed that M is a diagonal mass matrix with diagonal elements $$M_{3i-2,3i-2} = M_{3i-1,3i-1} = M_{3i,3i} = m_i \tag{61}$$

where $m_1$ is the mass of the ith vertex. This assumption about the mass does not limit the applicability of the rigid prediction step; the prediction may be used with a lumped-mass matrix that approximates the actual mass matrix if it happens to be nondiagonal. The implicit solve step that follows the prediction step may again use the full non-diagonal mass matrix. In a preferred embodiment, it is assumed that a single connected component is being simulated. There is no loss of generality because the predictions for different connected objects can be done independently.

Aspects of the invention apply an implicit integration scheme to compute the motion of the finite-element nodes under the influence of $f_{ext}$ only, discarding the internal force term $f_{int}$. This comes down to solving an implicit integration step where the finite-element nodes act as isolated particles under the influence of only external forces. From the resulting state $(x^{ie}, v^{ie})$, a preferred embodiment of the invention computes linear and angular momenta. Subsequently, a rigid prediction $(x^{re}, v^{re})$ of the end state is obtained that matches the linear and angular momenta of the isolated particles at the end time of the integration step.

As set out below, the formulas are based on the Backward Euler scheme, where the relation between the end velocity and the end position is given by $$\Delta t \, v^{n+1} = x^{n+1} - x^n \tag{62}$$

The end state is expressed in terms of the unknown end acceleration through $x^{n+1}(a)$ and $v^{n+1}(a)$. The motion of the finite-element nodes under the influence of the external forces alone is determined by the system of equations $$f_{ext}(x^{n+1}(a^{ie}), v^{n+1}(a^{ie}), t^{n+1}) - Ma^{ie} = 0. \tag{63}$$

Replacing $f_{ext}$ in this system with its linearization around $(x^n, v^n, t^{n+1})$ and using the linearity of both $x^{ie} = x^{n+1}(a^{ie})$ and in $v^{ie} = v^{n+1}(a^{ie})$ in $a^{ie}$, the Backward Euler step reduces to a linear system $$H_{ext} a^{ie} = j_{ext} \tag{64}$$

The earlier assumptions on the external force model and the mass matrix make $H_{ext}$ a 3×3 block-diagonal matrix. This allows each $(a^{ie})_i$ to be solved separately from $(j_{ext})_i$ using a linear solve that involves only 3 unknowns. The solutions of these linear solves can be put together to obtain an end state $(x^{ie}, v^{ie})$ that would result from simulating the finite element nodes as isolated particles under the influence of only external unconstrained forces.

Aspects of the invention use $(x^{ie}, v^{ie})$ to compute a center of mass, a linear momentum and an angular momentum for the body at the end time of the integration step. The center of mass for a global position vector x is defined by $$X = M^{-1} \sum_i m_i x_i, \tag{65}$$

where M is the sum of all node masses $m_i$. The linear momentum corresponding to a global velocity vector v is computed as $$P = \sum_i m_i v_i, \tag{66}$$

The angular momentum for (x, v) is computed as $$L = \Sigma_i m_i \tilde{x}_i \times v_i, \tag{67}$$

where each $\tilde{x}_i$ is a relative position vector $$\tilde{x}_i = x_i - X. \tag{68}$$

The isolated-particle solution $(x^{ie}, v^{ie})$ can be used to compute the center of mass $X^{ie}$, the linear momentum $p^{ie}$ and the angular momentum $L^{ie}$ of the body at the end time of the integration step. The center of mass $X^n$ corresponding to the global start position $x^n$ is needed as well. At the start time, each node has a relative position vector $\tilde{x}_i^n = x_i^n - X^n$.

For each time offset $\tau = t - t^n$, a rigid transformation $\Phi_\tau$ may be defined as $$\Phi_\tau(p) = X^n + \tau M^{-1} P^{ie} + R_\tau(p - X^n), \tag{69}$$

where the rotation matrix $R_\tau$ is defined using the matrix exponential exp by $$R_\tau = \exp(\tau \Omega), \tag{70}$$

and where for an angular velocity vector $\omega$, there is a corresponding 3×3 matrix $$\Omega = \begin{pmatrix} 0 & -\omega_3 & \omega_2 \\ \omega_3 & 0 & -\omega_1 \\ -\omega_2 & \omega_1 & 0 \end{pmatrix}. \tag{71}$$

The angular velocity $\omega$ that corresponds to the end time of the integration step can be computed as follows. For each time offset $\tau$, the corresponding inertia matrix is given by $$I_\tau(\omega) = (\sum_i m_i((\tilde{x}_i^n)^2 \Delta - (R_\tau \tilde{x}_i^n) \otimes (R_\tau \tilde{x}_i^n)), \tag{72}$$

where $\Delta$ denotes the 3×3 identity matrix. Ideally, embodiments of the present invention would compute the angular velocity $\omega$ by solving the equation $$I_{\Delta t}(\omega) \omega = L^{ie}. \tag{73}$$

This is a nonlinear system of equations in three unknowns. An approximate solution of this nonlinear system of equations can be found by performing Newton iterations. For each Newton iteration, this involves computing the partial derivatives of the elements of the inertia matrix in the components of $\omega$. An alternative, simpler-to-compute approximation $\omega$ can be found by substituting the inertia tensor for the start time, and solving the resulting linear system $$I_{\Delta t}(0) \omega = L^{ie}, \tag{74}$$

in which each term $R_\tau \tilde{x}_i^n$ is approximated by $\tilde{x}_i^n$.

Now that $\omega$ is known, it may be possible to compute the time-dependent rotation matrix $R_\tau$ using Equation 70, which in turn, makes it possible to compute the rigid transformation $\Phi_\tau$ according to Equation 69. The rigid prediction of the end state is defined in terms of $\Phi_\tau$. The predicted end position is computed as $$x^{re} = \Phi_{\Delta t}(x_i^n) = X^n + \Delta t\, M^{-1} P^{ie} + R_{\Delta t} \tilde{x}_i^n. \quad (75)$$

The corresponding prediction of the end velocity is computed as $$v^{re} = \frac{d}{d\tau}[\Phi_\tau(x_i^n)]_{\tau=\Delta t} = M^{-1} P^{ie} + \omega \times R_{\Delta t} \tilde{x}_i^n \quad (76)$$

The rigid prediction ($x^{re}$, $v^{re}$) that is produced by the present invention may have the following desirable properties. The predicted end position $x^{re}$ is a rigidly transformed version of the start position $x^n$. The linear momentum of the rigid prediction at the end time equals the linear momentum of the isolated-particle solution. If $\omega$ satisfies Equation 75, then the angular momentum of the rigid prediction at the end time equals the angular momentum of the isolated-particle solution. Table 7 summarizes the required steps for computing a rigid prediction.

TABLE 7

Compute an implicit rigid prediction

Predict-Rigid 1. compute the unconstrained external force $f_{ext}$ along with the corresponding Jacobian matrices $\partial f_{ext}/\partial x$ and $\partial f_{ext}/\partial v$ based on the start state ($x^n$, $v^n$) and the end time $t^{n+1}$
2. obtain $a^{ie}$ by solving $H_{ext} a^{ie} = j_{ext}$
3. compute $x^{ie}$ and $v^{ie}$ from $a^{ie}$ using Equation 2
4. compute a center of mass $$X^n := M^{-1} \sum_i m_i x_i^n$$

5. compute a center of mass $$X^{ie} := M^{-1} \sum_i m_i x_i^{ie}$$

6. compute a linear momentum $$P^{ie} := \sum_i m_i v_i^{ie},$$

7. compute an angular momentum $$L^{ie} := \sum_i m_i (x_i^{ie} - X^{ie}) \times v_i^{ie}$$

8. solve $I_{\Delta t}(\omega)\, \omega = L^{ie}$ to obtain an angular velocity $\omega$
9. compute the angular velocity matrix $$\Omega := \begin{pmatrix} 0 & -\omega_3 & \omega_2 \\ \omega_3 & 0 & -\omega_1 \\ -\omega_2 & \omega_1 & 0 \end{pmatrix}$$

10. compute a rotation matrix
   $R := \exp(\Delta t\, \Omega)$
11. for each node index i:
  (a) $x_i^{re} := X^n + \Delta t\, M^{-1} P^{ie} + R\tilde{x}_i^n$
  (b) $v_i^{re} := M^{-1} P^{ie} + \omega \times R\tilde{x}_i^n$ Smooth Embedded Deformation The total use of resources of a finite-element simulation depends on the number of tetrahedra in the simulated mesh; the more tetrahedra the simulated mesh contains, the more time may be required to perform an accurate simulation of this mesh. In addition, some numerical techniques for finite-element simulation may be sensitive to the quality of the tetrahedra; in such a case, the occurrence of tetrahedra that have very flat or very thin shapes may negatively affect the stability and efficiency of a simulation. A mesh that may be used for rendering often has much more detail than would be necessary to obtain a visually pleasing deformation or animation. Sometimes, a rendering mesh (a mesh that is intended to be used for rendering purposes) may not be practically useable for a direct finite-element simulation at all, because it may either take too much time to complete its simulation or because the presence of poorly shaped tetrahedra in the mesh prevents a stable simulation.

For these reasons, embedding methods exist, where an approximate mesh that has fewer tetrahedra and better-shaped tetrahedra than those present in the rendering mesh may be used instead of the rendering mesh in a finite-element simulation. After simulating this approximate mesh, any resulting deformations and animations may be then transferred to the rendering mesh. This process may generate results similar to what a direct simulation of the rendering mesh would produce, but with a smaller total computation time. The approximate model that is used in the simulation may be called the simulated mesh. The mesh that is used for rendering may be called the embedded mesh. Each deformation of the simulated mesh may lead to a corresponding deformation of the embedded mesh. In addition, an embedding method may transfer changes in topology in the simulated mesh, for example resulting from the simulation of material fracturing, to changes in topology of the embedded mesh.

Some existing approaches directly employ barycentric coordinates to compute deformed vertex positions for the embedded mesh in terms of the node positions of the tetrahedral in the simulated mesh. A drawback with this approach may be that there may be clearly visible artefacts; the barycentric approach may reveal the underlying structure and the boundaries of the (typically lower-resolution) simulated mesh in the deformation of the embedded mesh. The larger the difference in resolution between the simulated mesh and the embedded mesh, the more pronounced these effects become.

Preferred embodiments of the present invention as described here, use a different method for obtaining the embedded vertex positions from the positions of the simulated nodes. This results in deformations and animations that are less sensitive to the locations of the boundaries between the tetrahedra in the simulated mesh than those produced by prior art methods. To achieve this, preferred embodiments of the present invention define the deformation of an embedded vertex not only in terms of the node positions of a single parent tetrahedron, but on node positions in a neighborhood that may generally consist of more nodes than just the nodes of the single parent tetrahedron.

In addition, preferred embodiments of the present invention support the transfer of the results of a fracturing simulation, where the embedded mesh is fractured alongside the simulated mesh. This topology transfer may rely on a method that is unique to the preferred embodiments of the present invention. This method may rely on identifying the best matching locations of simulated mesh corners in the current simulated mesh. The present invention also lends itself to transferring other types of information besides positions. For example, vertex velocities and vertex normal vectors, which may commonly be used for rendering, may be obtained alongside the vertex positions of the deformed embedded mesh.

Preferred aspects of the present invention describe a method for deforming and fracturing an embedded mesh, based on a deformation and a fractured topology of a simulated mesh. The method of the present invention has at its inputs, a simulated reference mesh, an embedded reference mesh, and a current simulated mesh. The simulated reference mesh has all its vertex positions in a reference pose (e.g., an initial pose or a base pose). The embedded reference mesh has all its vertex positions in a base pose as well. Both the simulated reference mesh and the embedded reference mesh have a topology that represents the connectivity of the respective meshes before any simulated fracturing has occurred. The current simulated mesh may be deformed, having a different position for each vertex compared to the simulated reference mesh. In addition, the current simulated mesh may be fractured, so that some primitive corners that share a vertex in the simulated reference mesh may no longer share a vertex in the current simulated mesh. The embedded deformation algorithm, then applies the deformation of the current simulated mesh relative to the simulated reference mesh. The deformation of the simulated mesh is transferred in a sufficiently smooth manner to the embedded mesh as to obtain a visually pleasing current embedded mesh. Additionally, when the current simulated mesh is fractured relative to the simulated reference mesh, then the method of the present invention may apply corresponding topology changes to the current embedded mesh, relative to the topology of the embedded reference mesh.

The discussion below makes a clear distinction between the simulated reference mesh (SRM), the current simulated mesh (CSM), the embedded reference mesh (ERM) and the current embedded mesh (CEM). Here "current" may refer to the current frame for which a deformed, and possibly fractured mesh needs to be computed. Each CSM contains the current positions and velocities of all the vertices and also the current topology of the mesh. Each simulated tetrahedron vertex may have a corresponding finite element node in a simulation. The embedding algorithm explained in this section, allows an embedded mesh to be deformed in a very similar manner as the mesh that was previously simulated. Specifically, the deformation algorithm described here is interpolative; there is no loss of information. Any vertex of the embedded reference mesh that happens to have the same position as a vertex of the simulated reference mesh would follow the exact same trajectory as the corresponding simulated vertex, without smoothing or other artefacts (except for negligible round-off error). The embedded deformation stage not only computes positions from the source simulation, but it also determines consistent velocities and normal vectors for the embedded mesh. The result is a time sequence of positions, velocities and surface normal vectors for the embedded mesh. This time sequence provides the data necessary for creating a high-quality rendering of the animation, which can be incorporated as a special effect in a movie, a commercial or a computer game.

The description of the method of the present invention that is given below assumes that all geometric primitives in both the SRM and CSM are tetrahedra. In addition, the method relies on the assumption that the CSM has the same set of tetrahedra as the SRM. However, the position of each vertex may be different between these two meshes. The tetrahedra of the CSM and the SRM are called simulated tetrahedra. Each simulated tetrahedron f may be assigned an index in the contiguous range $1, \ldots, F$ where F is the total number of simulated tetrahedra. Thus, an identical tetrahedron-indexing scheme is used for the both the CSM and the SRM. The method exploits this correspondence.

The corners of the simulated tetrahedra may be assigned indices as well. These corners are called simulated corners. A unique index in the range $1, \ldots, 4F$ may be assigned to each corner c of each simulated tetrahedron. The set of all four corners that belong to f is denoted by $C_f$. Each simulated corner c belongs to a single simulated tetrahedron $f_c$. The same corner indexing scheme is used for the simulated corners in both the CSM and the SRM.

In contrast with simulated tetrahedrons and simulated corners, the set of vertices may be different for the SRM and the CSM. Due to the type of fracturing that is supported by an embodiment of the present invention, the CSM could have more vertices than the SRM. As a result, the indexing of vertices in the CSM may differ from the indexing of vertices in the SRM.

Each vertex u of the SRM may have an index in the range $1, \ldots, U$, where U is the total number of vertices in the SRM. Each simulated corner c has a corresponding vertex $u_c$ in the SRM. The mapping from c to $u_c$ defines the simulated reference topology. This simulated reference topology determines which tetrahedra may share a common vertex, a line segment, or a common triangular face in the SRM. The simulated reference topology determines where and how tetrahedral are connected to other tetrahedra in the SRM. These are the connections between the tetrahedra before any fracturing has occurred between them.

Similarly, each vertex v of the CSM may be assigned an index in the range $1, \ldots, N$, where N is the total number of vertices in the CSM. Due to fracturing, N may be larger than U. Each simulated corner c has an associated vertex $v_c$ in the CSM. This defines a simulated current topology. This topology represents the connections between the tetrahedra as they may be after fracturing has occurred. It is assumed that the inverse of the map $c \rightarrow v_c$ is accessible as well; a table (or some other data structure) may be available that can efficiently enumerate the set $C_v$ of all corners that map to a single vertex v of the CSM.

An embodiment of the present invention supports the deformation of meshes that have a dynamic topology; the simulated mesh may become fractured between two successive states. Whenever the simulated mesh was fractured between one state and another, there is an increase in the number of simulated vertices. At locations where fracturing occurs, corners that referred to the same vertex in the mesh before the fracture may no longer refer to the same vertex in the mesh after the fracture.

Even though the topology of the current simulated mesh may change from frame to frame, the same indexing of corners and the tetrahedra is used throughout. For example, f always references the same simulated tetrahedron in all the frames, and c always references the same simulated tetrahedron corner in all frames. However, the vertex indices may change as fracturing occurs between successive frames. In particular, the mapping $c \rightarrow v_c$ from corners to vertices may depend on the frame. The number of vertices N either stays the same or increases between frames. Distinct corners c and c' associated with distinct tetrahedra may share a common vertex $v = v_c = v_{c'}$, in one frame, but may have distinct vertex indices in the next frame.

In contrast to the simulated mesh, the embedded mesh is not restricted to consist of only tetrahedra; it may be comprised of any mix of geometric primitives, which include tetrahedra, polygons, line segments and individual particles (isolated vertices). The embedded primitives are indexed by numbers in the range 1, . . . , $\bar{F}$. Each embedded primitive has corners as well: an embedded tetrahedron may be defined by its four corners $\bar{c}_1, \ldots, \bar{c}_4$, an embedded polygon may be defined by the corners $\bar{c}_1, \ldots, \bar{c}_r$, where r is the number of polygon vertices, and an embedded line segment may be defined by two corners $\bar{c}_1$ and $\bar{c}_2$. A particle primitive may be defined simply by a single corner $\bar{c}_1$. For each embedded corner $\bar{c}$, there is a unique embedded primitive $\bar{f}_{\bar{c}}$ to which the corner belongs. The number of vertices of the ERM and the CEM are denoted by $\bar{U}$ and $\bar{N}$, respectively. For each corner, the corresponding vertex in the ERM and the CEM are denoted by $\bar{u}_c$ and $\bar{v}_c$, respectively. Each vertex $\bar{v}$ of the CEM may have corresponding vertex $\bar{u}$ in the ERM, such that all corners that map to $\bar{v}$ in the CEM also map to u in the ERM. This vertex $\bar{u}$ is called the reference vertex for $\bar{v}$.

The present invention's embedded deformation method, which is summarized in Table 10, computes transformed versions of the positions of the ERM. Before the deformation method can be applied there needs to a correspondence between the ERM and the SRM. This correspondence may be determined by the method of Table 8. Based on such a correspondence, at each frame, the deformation of the CSM relative to the SRM is analyzed and then a similar looking deformation is computed and applied to the ERM, to create the ERM, a deformed embedded mesh, for that frame. For example, if the CSM is rotated relative to the SRM, then a similar rotation may be applied to the ERM to obtain the CEM. In addition, differences in the topology of the CSM as compared to the SRM may be analyzed and similar topology changes may be applied to the ERM to obtain a CEM with a different topology. For example, if the simulated mesh breaks into two parts, then the embedded mesh may break into two parts as well, such that the fracture lines occur in similar positions as in the simulated mesh. The method that is summarized in Table 9 is responsible for computing the current embedded topology (for the CEM) that reflects the fracturing that may have occurred for the simulated topologies. Table 11 summarizes a combined method that computes an CEM that is both fractured and deformed.

The current simulated deformation is determined by comparing the positions at corners of the SRM with positions at the same corners of the CSM. At any fixed time in the simulation, the positions of all the N vertices (nodes) in the CSM can be represented by a single global position vector x. For each vertex v of the CSM, the corresponding position vector is denoted by $x_v$. Similarly, there is a global velocity vector v, that specifies for each vertex v of the CSM, a velocity vector $v_v$. To determine the deformation at each frame, an embodiment of the present invention compares x with a global vector of reference positions r, which stores the U vertex positions of the SRM topology. For each vertex u of the reference mesh, the corresponding reference position is indicated by $r_u$. Analogously, the embedded mesh has a reference position $\bar{r}_{\bar{u}}$ for each embedded reference vertex $\bar{u}$.

The correspondence of Table 8 may be computed only once, after which multiple current embedded meshes may be computed, corresponding to different frames. A correspondence is created between the ERM and the SRM, based on the global reference positions r and $\bar{r}$. The computation of the embedded mesh of Table 11 may be repeated for each simulated frame to create fractured and deformed versions of the ERM. These (possibly fractured) deformations at the frames together comprise an animation of the embedded geometry The correspondence stage works as follows. For each simulated tetrahedron f, a corresponding reference region $R_f$ is considered. This reference region is a representation of the tetrahedron as a closed subset of 3-dimensional space; it may be represented as the intersection of four linear half-spaces—one for each of the four tetrahedron facets. This representation may be used to help define a signed distance $s(p, R_f)$ of any point p in space to the tetrahedron. Any point that lies inside the tetrahedron would have a negative signed distance. For each embedded primitive $\bar{f}$, the centroid of the reference positions of its corners may be determined. Then, for each embedded primitive $\bar{f}$, a simulated primitive f may be determined such that the signed distance of the centroid of $\bar{f}$ to $R_f$ is minimized, where ties of equal signed distances are broken by selecting the lowest simulated primitive index. It may be assumed that each of the embedded primitive centroids lies inside some reference region; if this is not the case, an embodiment of the present invention may report this fact as an error to the user of the system. This process assigns to each embedded primitive $\bar{f}$, a single tetrahedron, which is denoted by parent[$\bar{f}$]. The steps of this procedure are summarized in Table 8.

TABLE 8

Initialize the correspondence between embedded and simulated meshes
Initialize-Correspondence 1. for each simulated tetrahedron f:
compute a corresponding reference region $R_f$ based on the reference position r
2. for each embedded primitive $\bar{f}$:
compute the centroid $\bar{r}_{\bar{f}}$ based on the reference position $\bar{r}$
3. for each embedded primitive $\bar{f}$:
parent[$\bar{f}$] := f, where f is the simulated primitive that minimizes $s(\bar{r}_{\bar{f}}, R_f)$, breaking ties by selecting the lowest-indexed f The computation of the CEM (Table 11) may consist of three parts: the location of embedded corners, the computation of a current embedded topology, and the computation of a deformation for the current embedded mesh. For each frame, a corresponding CEM may be computed. This work may be distributed over multiple separate computers or scheduled over multiple threads of execution on a single computer. Combinations of distribution and multi-threading may be possible as well. Even though a CEM may be computed for each frame, the correspondence data that is represented by the parent[$\bar{f}$] has to be computed only once. When support for fracturing is not needed (e.g., in use cases of the present invention for character animation), the corner-location step may have to be performed only once, and re-used over all frames.

The corner location step works as follows. Using the parent data of the correspondence stage, the location (a simulated tetrahedron) is determined for each embedded corner in the simulated mesh. For each embedded reference vertex $\bar{u}$, consider the set $\bar{C}_{\bar{u}}$ of embedded corners that map to it. For each $\bar{c}$, the signed distance of $\bar{r}_{\bar{u}_c}$ to the centroid of the embedded primitive $\bar{f}_{\bar{c}}$ may be determined. The maximum of these signed distances is denoted by $\in_{\bar{u}}$. This results in a signed distance $\in_{\bar{u}}$ for each vertex $\bar{u}$ of the CEM. Now for each embedded corner $\bar{c}$, a corresponding simulated tetrahedron location[$\bar{c}$] may be determined as follows. Consider the closed ball $\bar{B}$ with center at $\bar{r}_{\bar{u}_c}$ and with radius $\in_{\bar{u}_c}$. Define the local neighborhood of $\bar{c}$, denoted by $L_{\bar{c}}$, as the set of all simulated tetrahedra f for which the region $R_f$ intersects $\bar{B}$ and that are reachable from parent[$\bar{f}_{\bar{c}}$] by traversing common triangular facets in the topology of the CSM. Now location[$\bar{c}$] is chosen to be the index f of the tetrahedron in $L_{\bar{c}}$ that minimizes the signed distance to $\bar{r}_{\bar{u}_c}$, where ties between equal signed distances are broken by selecting the smallest tetrahedron index. This procedure assigns to each embedded corner $\bar{c}$, a unique location[$\bar{c}$].

The locations of the embedded corners in the simulated mesh are used to define a topology for the CEM as follows. The topology of the CEM is represented by the map from the embedded corner indices to the vertex indices of the CEM. Thus, for each embedded corner $\bar{c}$, a corresponding vertex $\bar{v}_{\bar{c}}$ must be chosen. The resulting set of vertices must have indices in the contiguous range 1, ..., N. Embodiments of the present invention consider the set of all embedded corners $\overline{C}_{\bar{u}}$ that map to a single vertex $\bar{u}$ of the ERM. Each such corner $\bar{c}$ has a location primitive location[$\bar{c}$] in the (possibly fractured) CSM. Current embedded vertices are assigned to embedded corners in such a way that for each $\bar{u}$, all pairs of corners $\bar{c}$ and $\bar{c}'$ in $\overline{C}_{\bar{u}}$ have $\bar{v}_{\bar{c}}=\bar{v}_{\bar{c}'}$, if and only if location[$\bar{c}$]=location[$\bar{c}'$]. That is, two corners that map to a single vertex in the ERM may be assigned the same vertex in the CEM exactly when these corners have the same location. The steps of this vertex-assignment algorithm are summarized in Table 9.

TABLE 9

Compute a topology for the current embedded mesh
Compute-Current- Embedded-Topology 1. avi := 1
2. for each vertex $\bar{u}$ of the CEM:
 (a) for each embedded corner $\bar{c}$ with $\overline{u}_{\bar{c}} = \bar{u}$: set lvi[cl[$\bar{c}$]] := 0
 (b) for each embedded corner $\bar{c}$ with $\overline{u}_{\bar{c}} = \bar{u}$:
 if lvi[cl[$\bar{c}$]] = 0, then:
 (i). lvi[cl[$\bar{c}$]] := avi
 (ii) create a vertex $\bar{v}_{\bar{c}}$ for the CEM at index avi
 (iii).   avi := avi + 1

An embodiment of the present invention defines for each simulated tetrahedron f a corresponding deformation map $$\Phi_f(p) = \sum_{c \in C(v)} w_c(p) \Phi_{v_c}(p), \quad (77)$$

where $\Phi_v$ defines a local deformation map for each vertex v of the CSM and where $w_c$ is a weight function for each corner c of f. Each local deformation map is defined only on reference positions p that lie within the tetrahedron's reference region $R_f$. For each embedded corner $\bar{c}$ that is located at this simulated tetrahedron (i.e., location[$\bar{c}$]=f), the deformation map $\Phi_f$ is used to compute a deformed position $\Phi_f(\bar{r}_{\bar{u}_{\bar{c}}})$.

The weights $w_c$ that help define each $\Phi_f$ are defined as follows. First, within each tetrahedron in reference position, define each $\gamma_c(p)$ as the barycentric coordinate of the corner c of f. For each of the corners c of the simulated tetrahedron f, the corresponding weight is defined as $$w_c(p) = \frac{\mu(\gamma_c(p))}{\sum_{c'} \mu(\gamma_{c'}(p))}, \quad (78)$$

where μ is a function that maps a barycentric coordinate onto a scalar and where c' ranges over the corners of f. The function μ may be chosen as $$\mu(\gamma) = \begin{cases} \exp(-1/(1-(\gamma-1)^2)) & \text{if } |\gamma - 1| < 1 \\ 0 & \text{otherwise} \end{cases} \quad (79)$$

An alternative, simpler choice would be $$\mu(\gamma) = 4\gamma^3 - \beta\gamma^4. \quad (80)$$

The per-tetrahedron deformation map of Equation 77 is based on per-vertex local deformation maps $\Phi_v$. The latter maps are defined as follows. The reference positions and the current positions of a simulated tetrahedron uniquely define a deformation gradient for that tetrahedron. Thus, for each tetrahedron, such a deformation gradient may computed and be stored. By taking a weighted average over all deformation gradients of tetrahedra that are adjacent to a vertex v, a corresponding 3×3 matrix $F_v$ may be obtained. The weighted averaging may be based, for example, on the local solid angle or on the volume of each tetrahedron. The local deformation map at a single simulated vertex v is now given in terms of this averaged deformation gradient as $$\Phi_v(p) := x_v + F_v(p - r_{u_v}), \quad (81)$$

where $u_v$ is the unique reference vertex for the vertex v. Alongside each $F_v$, a weighted-average $G_v$ of time-derivatives of deformation gradients adjacent to v can be computed as well. gradient can be computed as well. This can be used to express the time-derivative of the preceding equation as $$\Phi_v(p) := v_v + G_v(p - r_{u_v}). \quad (82)$$

This expression is used to assign a velocity to each vertex of the CEM. The step of computing all deformed positions, velocities and normal vectors is summarized in Table 9.

TABLE 10

Compute a deformation for the current embedded mesh

Compute-Current-Embedded-Deformation 1. for each vertex v of the CSM:
compute a weighted average $F_v$ of
all the deformation gradients of all tetrahedra that are adjacent to v in the CSM
2. for each vertex v of the CSM:
compute a weighted average $G_v$ of the time-derivatives of
all the deformation gradients of all tetrahedra that are adjacent to v in the CSM
3. for each simulated primitive f and each vertex $\bar{v}$ of the CEM with vl[$\bar{v}$] = f:
(a) find the reference vertex $\bar{u}$ that corresponds to $\bar{v}$
(b) $\bar{x}_{\bar{v}} := 0$
(c) $\bar{v}_{\bar{v}} := 0$
(d) $\bar{F}_{\bar{v}} := 0$
(e) P := $\bar{r}_{\bar{u}}$ TABLE 10-continued Compute a deformation for the current embedded mesh Compute-Current-Embedded-Deformation (f) for each c in $C_f$: compute $w_c := w_c(p)$ and $\dfrac{\partial w_c}{\partial p} := \dfrac{\partial w_c}{\partial p}(p)$ (g) for each c in $C_f$: $\overline{x_{\overline{v}}} := \overline{x_{\overline{v}}} + w_c(x_{v_c} + F_{v_c}(p - r_{u_c}))$
(h) for each c in $C_f$: $\overline{v_{\overline{v}}} := \overline{v_{\overline{v}}} + w_c(v_{v_c} + G_{v_c}(p - r_{u_c}))$ (i) for each c in $C_f$: $F_{\overline{v}} := F_{\overline{v}} + \dfrac{\partial w_c}{\partial p} \overline{X_{\overline{v}}} + w_c F_{v_c}$ (j) for each $\overline{c}$ with $\overline{v_{\overline{c}}} = \overline{v}$ : $\overline{n_{\overline{c}}} := (\overline{F_{\overline{v}}}^{-1})^T \overline{u_{\overline{c}}}$ Table 11 summarizes the steps that are preferred for determining the current embedded mesh, which may include both a new current embedded topology and a current embedded deformation. This table directly refers to the methods of Table 9 and Table 10.

TABLE 11

Compute the current embedded mesh for a single frame
Compute-Current-Embedded-Mesh 1. for each embedded corner $\overline{c}$:
perform a graph search to determine a simulated primitive $c|[\overline{c}] := f$,
where f is the simulated primitive of $L_{\overline{c}}$ that minimizes $s(\overline{r_{u_c}}, R_f)$,
breaking ties by selecting the lowest-indexed f
2. Compute-Current-Embedded-Topology
3. for each vertex $\overline{v}$ of the CEM:
(a) find the lowest-indexed embedded corner $\overline{c}$ with for which $\overline{v_{\overline{c}}} = \overline{v}$
(b) $v|[\overline{v}] := c|[\overline{c}]$
4. Compute-Current-Embedded-Deformation Although this disclosure has described and illustrated certain preferred embodiments, it may be to be understood that an embodiment of the present invention may be not restricted to those particular embodiments. Rather, the invention includes all embodiments which may be functional, mechanical or other equivalence of the specific embodiments and features that have been described and illustrated.

The invention claimed is:

1. A computer-based method, executable in a computer graphics system, for generating a physically plausible collision response within a simulation of the computer graphics system using an implicit integration scheme, that includes contact forces, and eliminates penetrations and prevents stickiness, the method comprising:
(a) a user defining a mass matrix (MM), a force model (FM), and a preconditioning operator (PO), wherein the force model may be a linear or nonlinear operator that defines a force vector for each combination of positions, velocities and time and the preconditioner may be a matrix or a linear operator that may be used to obtain a vector from another vector;
(b) the user specifying a user-defined accuracy (UDA), wherein the UDA is a threshold value to determine when a solution has been reached;
(c) initializing a current approximation (CA) of the solution of the implicit integration scheme;
(d) using Equations 13, 8 and 3, initializing an enabled set (ES) wherein the ES is a set of all contact indices that have a nonpositive signed distance at the CA;
(e) modifying the CA so that none of the contact constraints in the ES are being penetrated in accordance with Equations 33 and 34;
(f) initializing a previous polyline search direction (PSD) to a zero vector;
(g) setting a segment index (SI) to one;
(h) conducting a polyline search to modify the ES, the CA and the SI to improve the accuracy of the CA without introducing any penetrations and to obtain a current search direction (CSD);
(i) making the PSD equal to the CSD that resulted from the polyline search; and
(j) until the SI is one, repeat all the steps starting at (g).

2. The method of claim 1, wherein the method is conducted for a single time interval.

3. The method of claim 1, wherein the method is conducted for a plurality of time intervals.

4. The method of claim 1 wherein step (c) further comprises setting the initial coordinates of the CA as any set of numbers.

5. The method of claim 1 wherein step (c) further comprises solving the implicit integration scheme without incorporating collisions to obtain the initial coordinates of the CA.

6. The method of claim 1 wherein step (h) further comprises:
(i) computing a projected previous search direction (PPSD) from the PSD and the ES in accordance with Equations 38 and 39;
(ii) where the SI equals 1, removing from the ES each contact index for which an normal multiplier as defined from the CA by means of Equation 32 is nonpositive;
(iii) computing a current residual (CR) in accordance with Equation 23, making use of the MM, the FM, the ES and the CA;
(iv) computing a base search direction (BSD) by premultiplying CR with the inverse of the PO;
(v) where a dot product of the CR and the BSD is less than or equal to the UDA, then continue at step (i) of claim 1.

7. The method of claim 6 wherein step (v) further comprises:
(A) where a dot product of the CR and the BSD is greater than the UDA, computing the current search direction (CSD) as a linear combination of the PPSD and the BSD;
(B) where the dot product of the CR and the CSD is negative, then negating the CSD;

(C) finding an optimal search parameter (OSP) which is the smallest positive number that satisfies Equation 44 or a positive approximation thereof;

(D) determining the set of hit parameters (HP), which consists of all positive parameters that are less than or equal to the OSP and that can be obtained from Equation 47 from contacts that are not in ES;

(E) where the HP is empty, then setting the current search parameter (CSP) equal to the OSP, else set the CSP to the minimum of all parameters in the HP;

(F) updating the CA based on the CSP using Equation 43;

(G) inserting into the ES each contact index that has a nonpositive signed distance at the CA, according to Equations 13, 8 and 3; and (H) incrementing the SI by one;

(I) where the HP is empty, then executing the steps starting at step (i); and (J) repeating all the steps starting at step (i).

8. The method of claim 7, wherein the step (B) further comprises computing a current search direction (CSD) as a linear combination of the PPSD and the BSD in accordance with Equations 40 and 41.

9. The method of claim 1 further comprising:
(k) computing a normal-force multiplier tuple (NMT) from the ES and the CA in accordance with Equation 32; and
(1) computing a second CA by solving the system of Equation 48, where the ES and the NMT occur as constants.

10. The method of claim 9 further comprising:
(m) modify the CA so that none of the contact constraints in the ES are being penetrated in accordance with Equations 33 and 34.

11. The method of claim 10, where the entire sequence of steps is executed a user-specified number of times, where after each execution a total contact force, as determined by Equation 22, is added to F.

12. The method of claim 9, where the entire sequence of steps is executed using a user-specified number of times, where after each execution a total contact force, as determined by Equation 22, is added to F.

13. The method of claim 1, where the entire sequence of steps is executed a user-specified number of times, where after each execution a total contact force, as determined by Equation 22, and using a zero vector for a tangent multiplier tuple is added to F.

14. A computer-based method, executable in a computer graphics system, for avoiding unnecessary collision detections for a moving or deforming plurality of geometric primitives in a computer simulation, the method comprising:
(a) creating an augmented binary tree data structure wherein each node represents a moving, deforming region in space, using the steps described in Table 4;
(b) identifying a set of all geometric primitives with which potential collisions may occur, using the tree data structure of Step (a) as described in Table 5, for each simulated geometric primitive; and
(c) conducting continuous collision detection tests on all potentially colliding pairs of geometric primitives that were identified in Step (b).

15. A computer-based method, executable in a computer graphics system, for computing a rigid prediction of a motion of a deformable body in a computer simulation, the deformable body having a plurality of nodes as an initial approximation in an integration scheme, the method comprising:

(a) computing a linearization of the external force (LEF), using a start position vector and a start velocity vector at a first time point, which consists of an external force vector, a matrix of all first partial derivatives of the external force vector in the position variables, and a matrix of all first partial derivatives of the external force vector in the velocity variables;

(b) computing a first end acceleration vector (FEA), using the LEF, by solving the linear system of Equation 64;

(c) computing a first end position (FEP) and a first end velocity (FEV), using the FEA, according to Equation 2 at a second time point;

(d) computing a center of mass (CMF) of the deformable body at the first time point;

(e) computing a center of mass (CMS) of the deformable body at the second time point, using the FEP;

(f) computing a linear momentum (LM) of the deformable body at the second time point, using the FEV;

(g) computing an angular momentum (AM) of the deformable body at the second time point, using the CMS, the FEP and the FEV;

(h) computing an angular velocity (AV) of the deformable body at the second time point, using the CMF and the AM, by solving Equation 73;

(i) computing a rotation matrix (RM) at a second time point, using the AV, according to Equations 70 and 71;

(j) computing a global position vector at the second time point using the CMF, LM and the RM, according to Equation 75; and (k) computing the global velocity vector at the second time point, using the RM and the LM, according to Equation 76.

16. The method of claim 15 wherein step (b) further comprises:
(i) computing a reference centroid (RC), which is an average of the vertex positions of a geometric primitive, for each geometric primitive of the ERM; and
(ii) determining the primitive parent (PP), which is a simulated primitive whose corresponding RR has a minimal signed distance to the RC, for each geometric primitive of the ERM.

17. The method of claim 15 wherein step (f) further comprises:
(i) computing a weighted average of deformation gradients (ADG) of all adjacent tetrahedra, for each vertex of the CSM;
(ii) computing a corner weight (CW) and a vector of first partial derivatives of weights (CDW), for each corner of each primitive of the CEM; and
(iii) computing the current position as a weighted average of current positions given by Equation 81 for each vertex of the CEM.

18. The method of claim 17 wherein step (ii) further comprises:
(A) computing the corner weight (CW) and the vector of partial derivatives of the corner weight (CDW) for each corner of each primitive of the CEM, where the corner weights may be prescribed by Equation 78.

19. A computer-based method, executable in a computer graphics system, for determining a deformation and a topology of a first mesh having a plurality of geometric primitives in a computer simulation, based on a deformation of a second mesh having a plurality of tetrahedra that may have a different topology from the first mesh, the method comprising:
(a) a user defining a simulated reference mesh (SRM) having a plurality of tetrahedra, an embedded reference mesh (ERM) having a plurality of geometric primitives and a current simulated mesh (CSM) having a plurality of tetrahedra;

(b) initializing a correspondence between the plurality of geometric primitives of the ERM and the plurality of tetrahedrons of the SRM to obtain for each geometric primitive of the ERM a corresponding primitive parent (PP);

(c) computing a reference region (RR), which is a convex hull of all corners of a tetrahedron, for each tetrahedron of the SRM;

(d) determining a corner location (CL) for each primitive corner of the ERM, wherein the CL is an index of a primitive in the SRM in a neighborhood of the corresponding primitive parent that minimizes a signed distance of the position of the primitive corner in the ERM to the RR;

(e) determining a vertex location (VL) for each vertex of the current embedded mesh (CEM) by selecting a lowest-indexed corner that maps to that vertex and choosing the corresponding VL to be the CL of that corner; and (f) computing a position for each vertex of the CEM using the VL of that vertex and the plurality of vertex positions in the CSM.

20. The method claim 19 wherein step (f) further comprises
(i) computing a weighted average of time derivatives of deformation gradients (ATDG) of all adjacent tetrahedral, for each vertex of the CSM;
(ii) computing the current velocity as a weighted average of current velocities given by Equation 82 for each vertex of the CEM.

21. The method of claim 19, wherein step (f) further comprises
(i) computing a vertex deformation gradient (VDF) as a weighted average of the ADGs of all corners that map to the same vertex of the CEM, for each vertex of the CEM; and
(ii) computing the current normal using the VDF of the vertex of a corner and the normal of that corner in the ERM, for each corner of the CEM.

22. The method of claim 19 further comprising between steps (d) and (e):
(i) setting an available vertex index (AVI) to one;
(ii) performing Steps (iii) to (vii), for each embedded reference vertex (ERV) of the ERM, and terminate;
(iii) determining a set CI of corner indices that map to the ERV;
(iv) determining a set LCL that consists of all CL for all corners in CI;
(v) determining a number of unique corner locations (NUCL), by counting the number of distinct elements of the LCL;
(vi) assigning a distinct local vertex index (LVI) that must lie between AVI and AVI plus NUCL minus 1, to each CL in the NUCL; and
(vii) to each corner of the LCL, creating an associated vertex for the CEM, whose index is the LVI of that corner's CL.

* * * * *